United States Patent
Akiyama et al.

(10) Patent No.: US 11,495,656 B2
(45) Date of Patent: Nov. 8, 2022

(54) LIGHT EMITTING DEVICE, DISPLAY DEVICE, PHOTOELECTRIC CONVERSION DEVICE, ELECTRONIC DEVICE, AND WEARABLE DEVICE

(71) Applicant: CANON KABUSHIKI KAISHA, Tokyo (JP)

(72) Inventors: Takahiro Akiyama, Kanagawa (JP); Hiromasa Tsuboi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/319,305

(22) Filed: May 13, 2021

(65) Prior Publication Data

US 2021/0384280 A1 Dec. 9, 2021

(30) Foreign Application Priority Data

Jun. 4, 2020 (JP) .............................. JP2020-097831

(51) Int. Cl.
*H01L 27/32* (2006.01)
*G06F 1/16* (2006.01)
*G09G 3/3225* (2016.01)

(52) U.S. Cl.
CPC .......... *H01L 27/3276* (2013.01); *G06F 1/163* (2013.01); *G09G 3/3225* (2013.01); *G09G 2300/0426* (2013.01)

(58) Field of Classification Search
CPC ........... H01L 27/3276; H01L 27/14603; H01L 51/00; H01L 51/52; H01L 51/5203; G09G 3/3225; G09G 3/3233; G09G 2300/0426; G09G 2300/0852
See application file for complete search history.

(56) References Cited

U.S. PATENT DOCUMENTS

| | | | |
|---|---|---|---|
| 8,952,374 B2 | 2/2015 | Jinta et al. | |
| 9,634,079 B2* | 4/2017 | Ota | H01L 27/3276 |
| 9,813,651 B2* | 11/2017 | Mori | H01L 27/14603 |
| 10,210,813 B2* | 2/2019 | Kimura | G09G 3/3233 |
| 10,818,232 B2 | 10/2020 | Tsuboi et al. | |
| 10,867,561 B2 | 12/2020 | Ota et al. | |
| 10,998,392 B2 | 5/2021 | Tsuboi | |
| 2014/0284570 A1 | 9/2014 | Jinta et al. | |
| 2015/0076326 A1* | 3/2015 | Ohtsuki | H04N 5/3745 250/208.1 |

(Continued)

FOREIGN PATENT DOCUMENTS

JP  2014-186258 A  10/2014

*Primary Examiner* — Sardis F Azongha
(74) *Attorney, Agent, or Firm* — Venable LLP

(57) ABSTRACT

A light emitting device comprising a plurality of pixels arranged on a substrate to form a plurality of columns parallel to a first direction and a plurality of rows parallel to a second direction orthogonal to the first direction is provided. Each of the plurality of pixels includes a light emitting element, and a driving circuit configured to drive the light emitting element, the substrate includes a transistor region in which a plurality of transistors that form the driving circuit are arranged, the plurality of pixels include a first pixel and a second pixel, which are adjacent to each other in the first direction, and a virtual line parallel to the second direction, which passes through the transistor region of the first pixel, passes through the transistor region of the second pixel.

30 Claims, 18 Drawing Sheets

(56) References Cited

U.S. PATENT DOCUMENTS

| | | |
|---|---|---|
| 2019/0197947 A1* | 6/2019 | Miyasaka ............. G09G 3/003 |
| 2020/0126481 A1 | 4/2020 | Tsuboi |
| 2020/0143741 A1 | 5/2020 | Tsuboi et al. |
| 2021/0005142 A1 | 1/2021 | Tsuboi et al. |
| 2021/0111227 A1 | 4/2021 | Tsuboi |

* cited by examiner

LIGHT EMITTING DEVICE, DISPLAY DEVICE, PHOTOELECTRIC CONVERSION DEVICE, ELECTRONIC DEVICE, AND WEARABLE DEVICE

BACKGROUND OF THE INVENTION

Field of the Invention

The present invention relates to a light emitting device, a display device, a photoelectric conversion device, an electronic device, and a wearable device.

Description of the Related Art

There is known a light emitting device using, as a light emitting element, an organic EL (electroluminescence) element that emits light with brightness according to a current flowing to the element. In the light emitting device, to improve the resolution, microfabrication of a driving circuit configured to drive the organic EL element and decrease of pitches are required. Japanese Patent Laid-Open No. 2014-186258 shows effectively using a layer on the upper side of a gate electrode to increase the density of pixels.

In a transistor that forms a driving circuit, there is a limit to microfabrication of the transistor from the viewpoint of variations between pixels or an amount of a current supplied to the organic EL element.

SUMMARY OF THE INVENTION

Some embodiments of the present invention provide a technique advantageous in improving a resolution in a light emitting device.

According to some embodiments, a light emitting device comprising a plurality of pixels arranged on a substrate to form a plurality of columns parallel to a first direction and a plurality of rows parallel to a second direction orthogonal to the first direction, wherein each of the plurality of pixels includes a light emitting element, and a driving circuit configured to drive the light emitting element, the substrate includes a transistor region in which a plurality of transistors that form the driving circuit are arranged, the plurality of pixels include a first pixel and a second pixel, which are adjacent to each other in the first direction, and a virtual line parallel to the second direction, which passes through the transistor region of the first pixel, passes through the transistor region of the second pixel, is provided.

According to some other embodiments, a light emitting device comprising a plurality of pixels arranged on a substrate to form a plurality of columns parallel to a first direction and a plurality of rows parallel to a second direction orthogonal to the first direction, wherein each of the plurality of pixels includes a light emitting element, and a driving circuit configured to drive the light emitting element, the driving circuit is formed by a plurality of transistors, the plurality of transistors form a first group and a second group, each of which includes at least one transistor, in the plurality of transistors, a transistor of the first group has a source region, a gate region, and a drain region which are arranged along a first group virtual line parallel to the first direction, in the plurality of transistors, a transistor of the second group has a source region, a gate region, and a drain region which are arranged along a second group virtual line parallel to the first group virtual line, and in each of the plurality of pixels, a virtual line parallel to the second direction, which passes through a gate electrode of the transistor of the first group in the plurality of transistors, does not pass through a gate electrode of the transistor of the second group in the plurality of transistors, is provided.

According to still other embodiments, a light emitting device comprising a plurality of pixels arranged on a substrate to form a plurality of columns parallel to a first direction and a plurality of rows parallel to a second direction orthogonal to the first direction, wherein each of the plurality of pixels includes a light emitting element, and a driving circuit configured to drive the light emitting element, the substrate includes a transistor region in which a plurality of transistors that form the driving circuit are arranged, the plurality of pixels include a first pixel and a second pixel, which are adjacent to each other in the first direction, and a third pixel adjacent to the first pixel and the second pixel in the second direction, and a virtual line parallel to the second direction, which passes through the transistor region of the third pixel, passes through one of the transistor region of the first pixel and the transistor region of the second pixel, and virtual lines parallel to the second direction, which pass through gate electrodes of the plurality of transistors of the third pixel, do not pass through gate electrodes of the plurality of transistors of the first pixel and the second pixel, is provided.

Further features of the present invention will become apparent from the following description of exemplary embodiments (with reference to the attached drawings).

DESCRIPTION OF THE EMBODIMENTS

Figure 1:
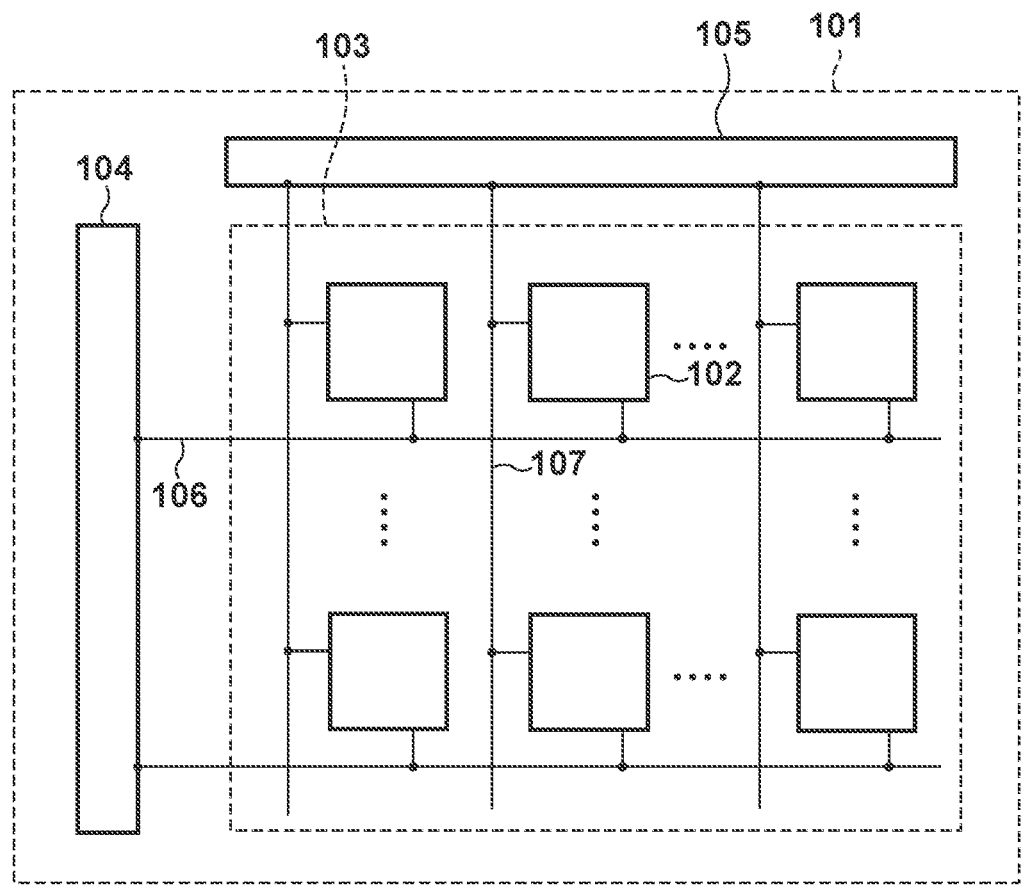
FIG. 1 is a view showing the outline of a light emitting device according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

This embodiment is a light emitting device in which a light emitting element arranged in each pixel is driven by a driving circuit corresponding to each light emitting element and formed on a semiconductor substrate. The light emitting element can have any material constitution/structure and can use a liquid crystal, an organic light emitting diode (OLED, organic EL), an inorganic LED, or a quantum dot LED, and its light emission brightness can electrically be controlled by the driving circuit. The driving circuit and the light emitting element are electrically connected and formed on the same semiconductor substrate. However, there is no restrictions to the geometric positional relationship between the driving circuit and the light emitting element. The driving circuits are two-dimensionally arrayed in consideration of the corresponding relationship with the light emitting elements. As for the array form of the light emitting elements, any array method such as a square array or a hexagonal close-packed array can be used. In addition, the number of colors emitted by the light emitting device is not particularly limited.

A driving circuit is formed by a circuit element including a plurality of transistors per pixel. A region where the transistors formed on the semiconductor substrate are arranged is defined as a transistor region. In other words, the substrate includes a transistor region in which a plurality of transistors forming a driving circuit are arranged. One transistor region includes the active region of a plurality of transistors configured to drive one or a plurality of light emitting pixels and a region where terminals are arranged. If a transistor is a field effect transistor such as a MOSFET, the terminals are a source region (source terminal), a drain region (drain terminal), and a gate region (gate terminal). Normally, a MOSFET is connected to a wiring layer on the upper side by a via. Here, the via and the wiring layer are not included in the constituent elements of the transistor region. If the transistor is a MOSFET, a well terminal is sometimes formed in each transistor region. The well terminal in this case is a constituent element in the transistor region. The transistor regions need not always have identical transistor configurations, and the transistor configuration in the transistor region may be different between adjacent pixels. Also, for example, even if the transistor configurations are identical, the arrangement may be changed, like a mirror image arrangement.

If pixels adjacent to each other have portions of the same potential, the driving circuits of the different pixels can share terminals that form transistors. In this case, the transistor region boundary between the driving circuits can exist on the shared terminals.

A light emitting device according to this embodiment will be described below with reference to the accompanying drawings. Note that all embodiments to be described below merely show examples of embodiments, and numerical values, shapes, materials, constituent elements, and the arrangements and connection forms of the constituent elements are not intended to limit the embodiments.

FIG. 1 is a block diagram showing the outline of a light emitting device 101 according to this embodiment. The light emitting device 101 includes a plurality of pixels 102 arranged on a substrate to form a plurality of columns parallel to a row direction and a plurality of rows parallel to a column direction orthogonal to the row direction. Each of the plurality of pixels 102 includes a light emitting element and a driving circuit configured to drive the light emitting element. As an input to the driving circuit, a control signal is sent from a vertical scanning circuit 104 via a scan line 106, and a light emission signal is sent from a signal output circuit 105 via a signal line 107. As the light emitting element, an organic EL element is electrically connected to the driving circuit and controlled to emit light.

Figure 2:
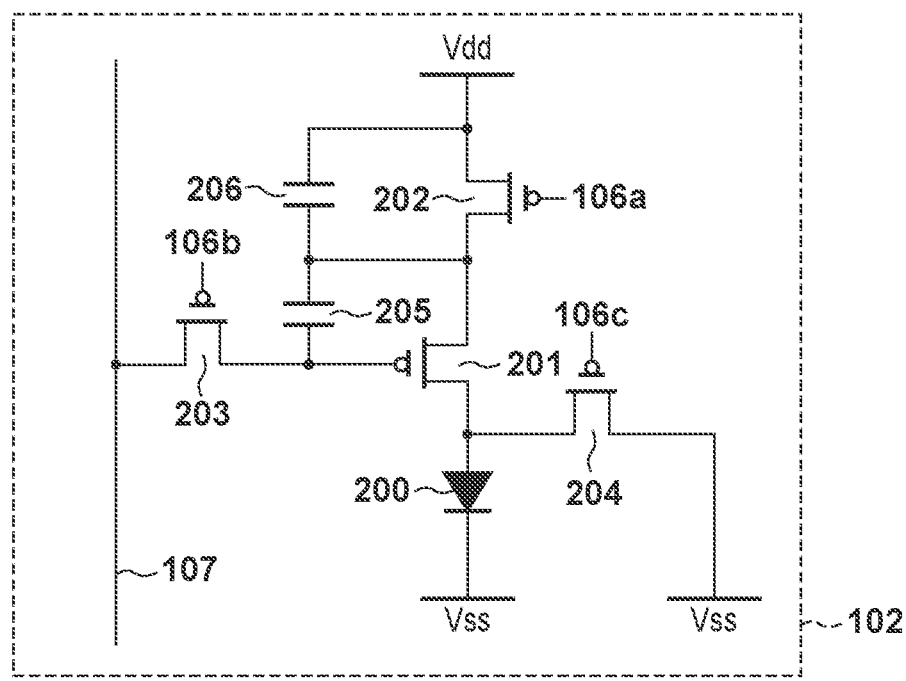
FIG. 2 is a circuit diagram of a pixel of the light emitting device shown in FIG. 1.

FIG. 2 is a circuit diagram of the driving circuit of the pixel 102 according to this embodiment. The pixel 102 includes an organic EL element 200 as a light emitting element. Also, the pixel 102 includes, as a driving circuit, four transistors including a drive transistor 201, a light emission control transistor 202, a write transistor 203, a reset transistor 204, and two electrostatic capacitors 205 and 206. The driving circuit is connected to power supply potentials Vdd and Vss. The four transistors that form the driving circuit are p-type transistors. The control signal is input to the gate electrodes of the light emission control transistor 202, the write transistor 203, and the reset transistor 204 via three scan lines 106a, 106b, and 106c, respectively.

The signal line 107 is connected to the source region of the write transistor 203. When the write transistor 203 is turned on, the voltage value of the signal line 107 is input to the gate electrode of the drive transistor 201. Depending on the signal voltage, a current value flowing between the source region and the drain region of the drive transistor 201 is decided, and the light emission brightness of the organic EL element 200 is controlled. The drain region of the drive transistor 201 is electrically connected to the anode of the organic EL element 200 and the source region of the reset transistor 204. If the reset transistor 204 is on, no current flows to the organic EL element 200, and it does not emit light. The source region of the light emission control transistor 202 is connected to the power supply potential Vdd, and the drain region is electrically connected to the source region of the drive transistor 201 to control light emission or non-light emission of the organic EL element 200. The cathode of the organic EL element 200 and the drain region of the reset transistor are connected to the power supply potential Vss and thus have the same potential. The power supply potential Vdd is, for example, +10 V based on the power supply potential Vss. Setting of these potentials is decided by the photoelectric conversion characteristic of the organic EL element 200 that is a light emitting element.

Figure 3:
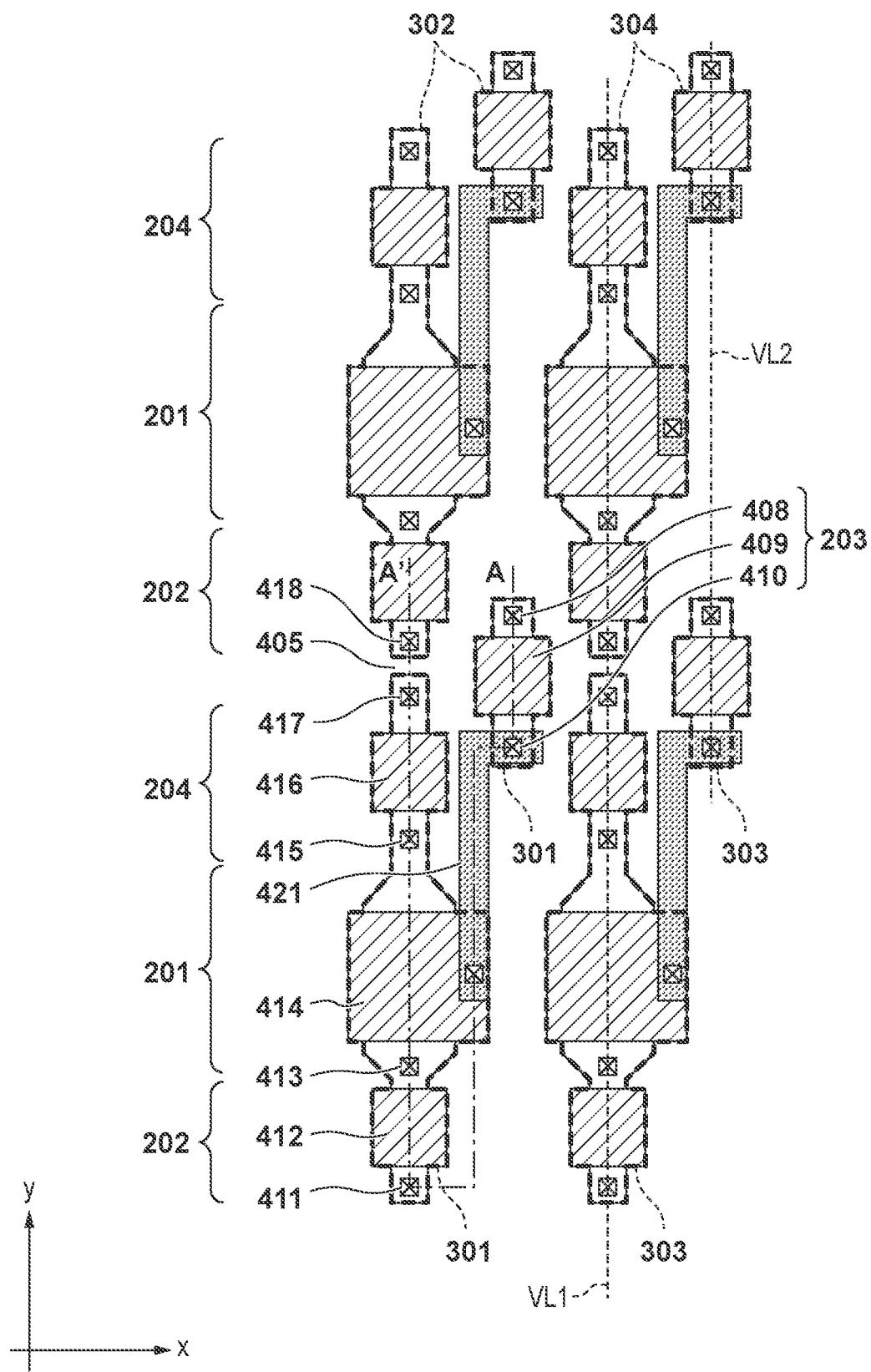
FIG. 3 is a plan view of the driving circuit of the pixel shown in FIG. 2.

FIG. 3 is a plan view showing the arrangement of the drive transistor 201, the light emission control transistor 202, the write transistor 203, and the reset transistor 204, which form the driving circuit according to this embodiment, on the substrate. The horizontal (lateral) direction of FIG. 3 is defined as an x direction, and the direction (the vertical direction of FIG. 3) perpendicular to the x direction on the surface of the substrate is defined as a y direction. The source regions, the gate regions, and the drain regions of the light emission control transistor 202, the drive transistor 201, and the reset transistor 204 are arranged on a line parallel to the y direction. A source region 408 and a drain region 410 of the write transistor 203 are isolated by an insulator from the remaining three transistors, and the source region 408, the gate region, and the drain region 410 are arranged in parallel to the y direction. In the circuit shown in FIG. 2, the drain region of the light emission control transistor 202 and the source region of the drive transistor 201 have the same potential, and these transistors are arranged as sharing nodes that share a single diffusion region 413, as shown in FIG. 3. Similarly, since the drain region of the drive transistor 201 and the source region of the reset transistor 204 have the same potential, these transistors are arranged as sharing nodes that share a single diffusion region 415. The drain region 410 of the write transistor 203 and a gate electrode 414 of the drive transistor 201 are the same terminal on the circuit diagram of FIG. 2 and are therefore made conductive via a wiring pattern 421, as shown in FIG. 3. Since FIG. 3 is a plan view on the semiconductor substrate, connecting lines shown in the circuit diagram of FIG. 2 are not illustrated. A wiring layer is stacked on the transistors on the semiconductor substrate, and the circuit shown in FIG. 2 is implemented by wiring patterns and through vias. A sectional structure will be shown in FIG. 4 later.

In the light emitting device 101 according to this embodiment, the driving circuits are arranged to correspond to the two-dimensionally arrayed light emitting elements (organic EL elements 200). The arrangement form may be different from the array of the light emitting elements. The driving circuits are arranged such that at least their arrangement density becomes equal to or more than that of the light emitting elements.

Each of transistor regions 301, 302, 303, and 304 surrounded by broken lines shown in FIG. 3 is a region occupied by the active regions (gate regions), source regions, drain regions, and gate electrodes (gate terminals) of four transistors that form a driving circuit on an orthogonal projection to the semiconductor substrate. The source region and the drain region may be defined as, for example, regions of a conductivity type opposite to a well layer. Alternatively, for example, the source region and the drain region may be defined as regions of a conductivity type opposite to the active region when the transistor is off. Otherwise, for example, the source region and the drain region may be defined as regions whose impurity density is 10 or more times higher than in the active region when the transistor is off. The active region may be defined as a region formed under the gate electrode and configured to transfer charges between the source region and the drain region in accordance with a change of the potential of the gate electrode. The active region can also be called a channel region. The gate electrode may be defined as, for example, a conductive pattern that forms the gate electrode. In addition, the gate electrode can have various shapes in accordance with the layout of the pixels. For this reason, the transistor region may be a region occupied by the active regions, source regions, and drain regions of the plurality of transistors that form the driving circuit on the orthogonal projection to the semiconductor substrate. The transistors arranged in each of the transistor regions 301 to 304 form a circuit that drives one organic EL element 200. FIG. 3 shows transistor regions in which a plurality of transistors that form driving circuits corresponding to four pixels 102 (four organic EL elements 200) are arranged. The write transistor 203 is isolated from the drive transistor 201, the light emission control transistor 202, and the reset transistor 204 via an insulator isolating portion, and each of the transistor regions 301 to 304 is formed including the write transistor 203.

The relationship of the transistor regions of the pixels 102 adjacent to each other in the y direction of FIG. 3 in the plurality of pixels 102 will be described here. In other words, this is the relationship between the transistor region 301 and the transistor region 302, which are adjacent to each other in the y direction. As shown in FIG. 3, a virtual line that is parallel to the y direction and passes through the transistor region 302 passes through the transistor region 301. In synonymous sense, the end portion of the transistor region 301 on the side of the transistor region 302 is arranged on the upper side of the end portion of the transistor region 302 on the side of the transistor region 301 concerning the y direction in the arrangement shown in FIG. 3. When the transistor region 301 and the transistor region 302 include regions overlapping in the x direction, the arrangement density of the transistors that form the driving circuits can be increased. This can increase the resolution of the light emitting device 101 without microfabrication of the transistors.

In this embodiment, of the plurality of transistors arranged in each of the transistor regions 301 to 304, the transistors whose source regions, gate regions, and drain regions are arranged along a virtual line VL1 (first group virtual line) parallel to the y direction are called transistors of a first group. More specifically, the drive transistor 201, the light emission control transistor 202, and the reset transistor 204 are called transistors of the first group. Of the plurality of transistors arranged in each of the transistor regions 301 to 304, the transistors whose source regions, gate regions, and drain regions are arranged along a virtual line VL2 (second group virtual line) parallel to the virtual line VL1 are called transistors of a second group. More specifically, the write transistor 203 is called a transistor of the second group. The plurality of transistors arranged in each of the transistor regions 301 to 304 form the first and second groups each including at least one transistor.

The source regions, the gate regions, and the drain regions of the transistors of the first and second groups are arranged in parallel to the y direction. As shown in FIG. 3, virtual lines along the x direction, which pass through gate electrodes 412, 414, and 416 of the transistors of the first group, do not pass through a gate electrode 409 of the transistor of the second group. Referring to FIG. 3, a gate electrode is a region indicated by hatching. For example, the virtual lines parallel to the x direction, which pass through the gate electrodes 412, 414, and 416 of the transistors of the first group arranged in the transistor region 302, do not pass through the gate electrode 409 of the transistor of the second group. Also, for example, the virtual lines parallel to the x direction, which pass through the gate electrodes 412, 414, and 416 of the transistors of the first group arranged in the transistor region 302, do not pass through the gate electrode 409 of the transistor of the second group arranged in the transistor region 301.

In transistor shapes as shown in FIG. 3, the distance between the gate electrodes of the transistors sometimes decides the arrangement density of the transistors. When the transistors are arranged such that the gate electrodes do not face in the x direction, the array density of the driving circuits in the x direction in FIG. 3 can further be increased. In the y direction of FIG. 3, however, since the driving circuits are arranged long, the lower end portion of the transistor region (for example, the transistor region 302) adjacent in the y direction is arranged on the lower side of the position of the source region 408 of the write transistor 203 arranged in the transistor region 301 and the gate electrodes in the transistor region 301 and the transistor region 302 are arranged not to face, thereby enabling a close-packed arrangement of driving circuits in the y direction as well. In the configuration shown in FIG. 3, a virtual line parallel to the x direction, which passes through a source region 418 of the light emission control transistor 202 arranged in the transistor region 302, passes through the gate electrode 409 of the write transistor 203 in the transistor region 301.

Since this embodiment assumes an example in which light emitting elements of three colors are arranged, the ratio of the arrangement interval between the transistor regions 301 to 304 in the x direction, in which the driving circuits are arranged, to the arrangement interval in the y direction is 1:3. Hence, if the pixels 102 of three colors are defined as one "display pixel", the array intervals of the "display pixels" in the x and y directions are equal. That is, if each of the transistor regions 301 to 304, in which a driving circuit corresponding to one organic EL element 200 is arranged, is defined as the region of one pixel 102, it can be said that the pitch between the pixels 102 arranged in the y direction in the plurality of pixels 102 is wider than the pitch between the pixels 102 arranged in the x direction. Here, focus is placed on the transistor regions (for example, the transistor region 301 and the transistor region 303) corresponding to the two pixels 102 adjacent to each other in the x direction. At this time, as shown in FIG. 3, the transistor region 303 can be arranged at a position where the transistor region 301 is translated in the x direction.

The driving circuit including the drive transistor 201, the light emission control transistor 202, the write transistor 203, and the reset transistor 204, which drives the organic EL element 200 as one light emitting element, is arranged as described above. This can increase the arrangement density of the transistors of the driving circuits on the substrate. This makes it possible to increase the density of the organic EL elements 200 serving as light emitting elements without microfabrication of the transistors and implement the light emitting device 101 having a higher resolution.

Figure 4:
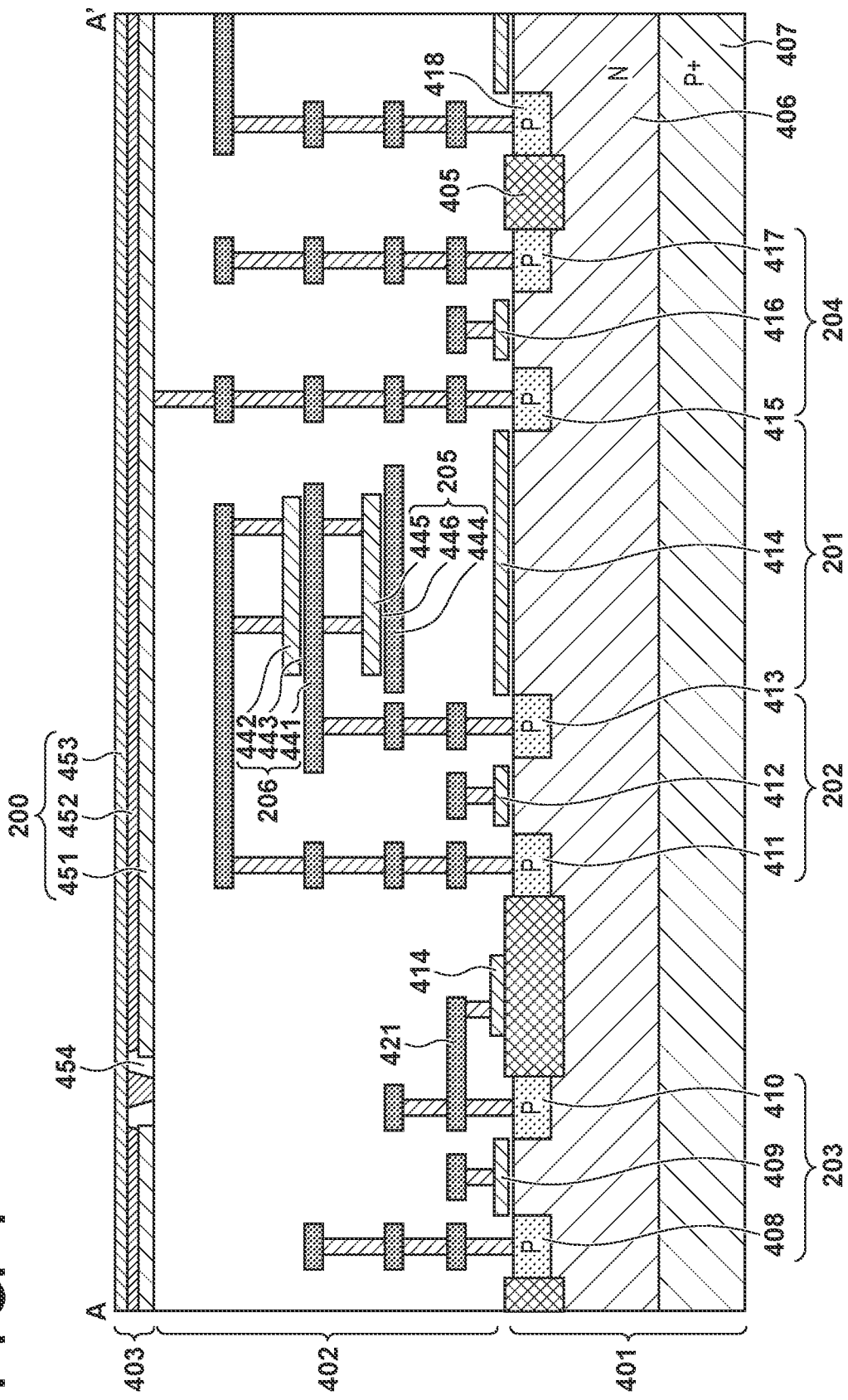
FIG. 4 is a sectional view of the driving circuit of the pixel shown in FIG. 2.

FIG. 4 shows a section between A and A' shown in FIG. 3. FIG. 4 shows an example of the sectional structure of the driving circuit (the drive transistor 201, the light emission control transistor 202, the write transistor 203, and the reset transistor 204), the organic EL element 200 that is a light emitting element, a wiring layer, and the electrostatic capacitors 205 and 206 according to this embodiment. The light emitting device 101 according to this embodiment is configured to include a semiconductor substrate 401, a wiring layer 402 formed on the substrate 401, and a light emitting layer 403. The substrate 401 includes, as a base, a p-type single-crystal silicon substrate 407. An n-type well layer 406 is formed, and MOSFETs that are transistors are formed on that. The n-type well layer 406 is electrically connected to the power supply voltage Vdd. The transistors that do not share a terminal are insulated and isolated by an insulator isolating portion 405. In this embodiment, the insulator isolating portion 405 is implemented by an STI (Shallow Trench Isolation) structure. The insulator isolating portion 405 can also be replaced with LOCOS (Local Oxidation Of Silicon) isolation, Deep Trench Isolation (DTI), an n-type diffusion layer isolation, or the like. The STI structure according to this embodiment is formed using silicon oxide to a depth of about 0.3 μm to 1.0 μm from the surface of the substrate 401. The drive transistor 201, the light emission control transistor 202, the write transistor 203, and the reset transistor 204 include the gate electrodes 414, 412, 409, and 416 of polysilicon, respectively, on a thin insulating film formed on the substrate 401. The source regions and the drain regions of the drive transistor 201, the light emission control transistor 202, the write transistor 203, and the reset transistor 204 are formed by a p-type diffusion layer and electrically connected to the wiring layer by through vias.

The power supply voltage of the power supply Vdd shown in FIG. 2 is supplied to a source region 411 of the light emission control transistor 202 via the wiring layer 402 formed by a plurality of pattered metal layers and through vias that electrically connect these layers. The wiring layer 402 includes not only the wiring patterns but also upper electrode patterns 442 and 445 and thin-film insulating layers 443 and 446, which form the electrostatic capacitors 205 and 206. The thickness of the thin-film insulating layers 443 and 446 that form the electrostatic capacitors 205 and 206 is several tens of nm. For the wiring patterns and the vias in the wiring layer 402, tungsten, molybdenum, titanium, aluminum, neodymium, chromium, cobalt, copper, or gold, a stacked layer, a compound, or an alloy thereof, or a compound or an alloy with silicon or a metal such as copper can be used. For the insulating layer of the wiring layer 402, silicon oxide or silicon nitride can be used.

The light emitting layer 403 is formed on the wiring layer 402. The light emitting layer 403 is configured to include an anode 451, an organic light emitting layer 452, a cathode 453, and a bank portion 454 of the organic EL element 200. The bank portion 454 has a function of suppressing electrical crosstalk between adjacent pixels 102 (light emitting elements). The light emission direction is the upward direction in FIG. 4, and the cathode 453 has a sufficient light transmission characteristic in the light emission wavelength region.

A scan signal sent via the scan line 106a is input to the gate electrode 412 of the light emission control transistor 202 via the wiring pattern in the wiring layer 402 and controls the light emission control transistor 202. When the light emission control transistor 202 is on, the power supply potential Vdd is applied to the source region (diffusion region 413) of the drive transistor 201.

A scan signal sent via the scan line 106b is input to the gate electrode 409 of the write transistor 203 via the wiring pattern in the wiring layer 402 and controls the write transistor 203. When the write transistor 203 is on, a signal potential sent via the signal line 107 is applied to the gate electrode 414 of the drive transistor 201. Since the write transistor 203 is insulated from the drive transistor 201 by the insulator isolating portion 405, the drain region 410 of the write transistor 203 and the gate electrode 414 of the drive transistor 201 are connected via the wiring pattern 421 in the wiring layer 402. By the potential of the gate electrode 414 of the drive transistor 201, the drain current of the drive transistor 201, that is, the current flowing to the organic EL element 200 that is a light emitting element is controlled, and the light emission brightness is decided. The drain region (diffusion region 415) of the drive transistor 201 is connected to the anode 451 of the organic EL element 200 via the wiring pattern in the wiring layer 402 or the like.

A scan signal sent via the scan line 106c is input to the gate electrode 416 of the reset transistor 204 via the wiring pattern in the wiring layer 402 and controls the reset transistor 204. When the reset transistor 204 is on, the anode 451 rendered conductive with the source region (diffusion region 415) of the reset transistor 204 is set to the power supply voltage Vss. The cathode 453 of the organic EL element 200 can be an electrode common to all organic EL elements 200, and the power supply potential Vss is supplied. Hence, when the reset transistor 204 is on, the anode 451 and the cathode 453 of the organic EL element 200 are set to an equipotential, light emission stops, and the organic EL element 200 is reset.

Figure 5:
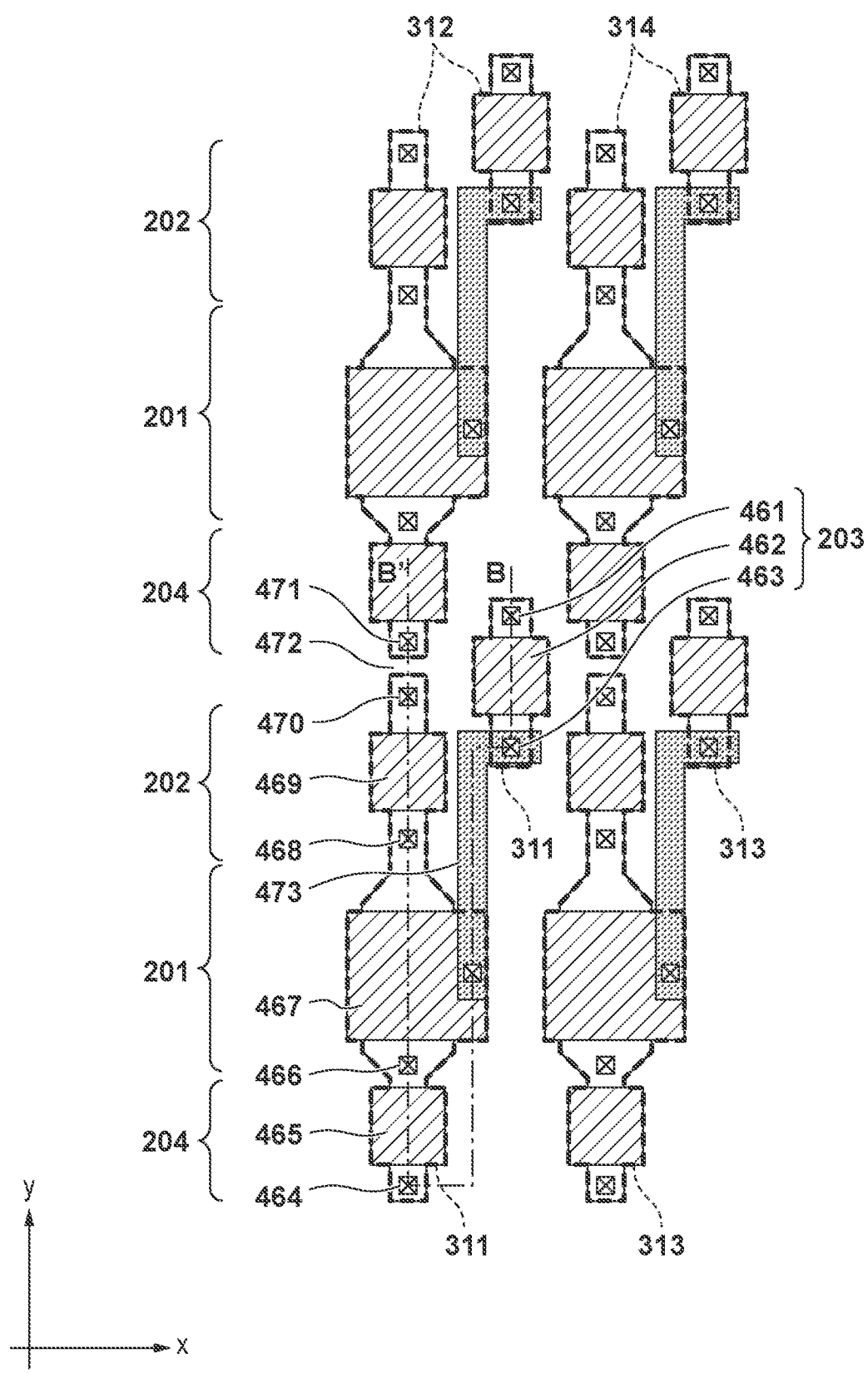
FIG. 5 is a plan view of the driving circuit of the pixel shown in FIG. 2.
Figure 6:
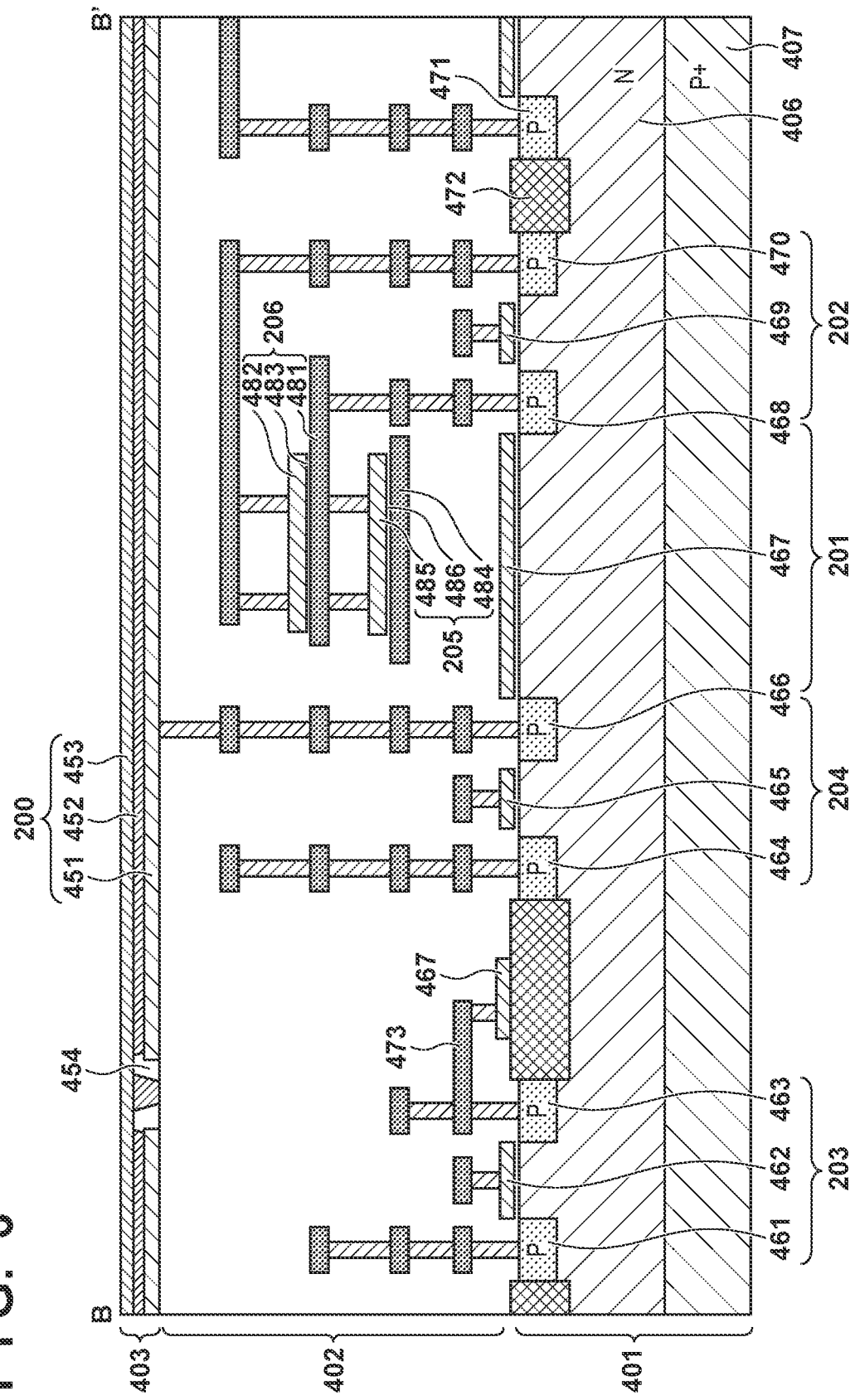
FIG. 6 is a sectional view of the driving circuit of the pixel shown in FIG. 2.

FIGS. 5 and 6 show a modification for the arrangement of the driving circuit including the drive transistor 201, the light emission control transistor 202, the write transistor 203, and the reset transistor 204 shown in FIG. 3. In the configuration shown in FIG. 3, in the transistor region 302, the light emission control transistor 202, the drive transistor 201, and the reset transistor 204 are arranged in this order from the side of the transistor region 301. On the other hand, in the configuration shown in FIG. 5, in a transistor region 312, the reset transistor 204, the drive transistor 201, and the light emission control transistor 202 are arranged in this order from the side of a transistor region 311.

Here, focus is placed on the transistor regions (for example, the transistor region 311 and the transistor region 312) corresponding to the two pixels 102 adjacent to each other in the y direction. In the configuration shown in FIG. 5, a virtual line parallel to the x direction, which passes through a drain region 471 of the reset transistor 204 arranged in the transistor region 312, passes through a gate electrode 462 of the write transistor 203 in the transistor region 311. Also, a virtual line parallel to the x direction, which passes through the gate electrode 462 of the write transistor 203 in the transistor region 311, does not pass through gate electrodes 465, 467, and 469 of the transistors (the drive transistor 201, the light emission control transistor 202, and the reset transistor 204) of the first group arranged in the transistor region 311. In addition, a virtual line parallel to the x direction, which passes through the gate electrode 462 of the write transistor 203 in the transistor region 311, does not pass through the gate electrodes of the transistors (the drive transistor 201, the light emission control transistor 202, and the reset transistor 204) of the first group arranged in the transistor region 312. With this configuration, the driving circuits configured to drive the organic EL elements 200 that are light emitting elements can be arranged at a high density, as in the configuration shown in FIG. 3. This can increase the resolution of the light emitting device 101 in the configuration shown in FIG. 5 as well.

FIG. 6 shows a section between B and B' shown in FIG. 5. The configurations and materials of layers can be the same as in the section shown in FIG. 4 described above, but the array of the light emission control transistor 202 and the reset transistor 204 is different. Along with this, the configuration of the wiring layer 402 also partially changes. The structure of the organic EL element 200 that is a light emitting element can be the same as in the configuration shown in FIG. 4.

A scan signal sent via the scan line 106a is input to the gate electrode 469 of the light emission control transistor 202 via the wiring pattern in the wiring layer 402 and controls the light emission control transistor 202. When the light emission control transistor 202 is on, the power supply potential Vdd is applied to a source region 468 of the drive transistor 201.

A scan signal sent via the scan line 106b is input to the gate electrode 462 of the write transistor 203 via the wiring pattern in the wiring layer 402 and controls the write transistor 203. When the write transistor 203 is on, a signal potential sent via the signal line 107 is applied to a gate electrode 467 of the drive transistor 201. Since the write transistor 203 is insulated from the drive transistor 201 by the insulator isolating portion 405, a drain region 463 of the write transistor 203 and the gate electrode 467 of the drive transistor 201 are connected via the wiring pattern 421 in the wiring layer 402. By the potential of the gate electrode 467 of the drive transistor 201, the drain current of the drive transistor 201, that is, the current flowing to the organic EL element 200 that is a light emitting element is controlled, and the light emission brightness is decided. The drain region (diffusion region 466) of the drive transistor 201 is connected to the anode 451 of the organic EL element 200 via the wiring pattern in the wiring layer 402 or the like.

A scan signal sent via the scan line 106c is input to the gate electrode 465 of the reset transistor 204 via the wiring pattern in the wiring layer 402 and controls the reset transistor 204. When the reset transistor 204 is on, the anode 451 rendered conductive with the source region (diffusion region 466) of the reset transistor 204 is set to the power supply voltage Vss. The cathode 453 of the organic EL element 200 can be an electrode common to all organic EL elements 200, and the power supply potential Vss is supplied. Hence, when the reset transistor 204 is on, the anode 451 and the cathode 453 of the organic EL element 200 are set to an equipotential, light emission stops, and the organic EL element 200 is reset.

In the configuration shown in FIG. 5, the drive transistor 201, the light emission control transistor 202, and the reset transistor 204 are arranged at positions reversed from those in the configuration shown in FIG. 3. However, the present invention is not limited to this, and, for example, in the configuration shown in FIG. 5, the source region 408 and the drain region 410 of the write transistor 203 may be reversed. In the configuration shown in FIG. 3 as well, the source region 408 and the drain region 410 of the write transistor 203 may be reversed.

Figure 7:
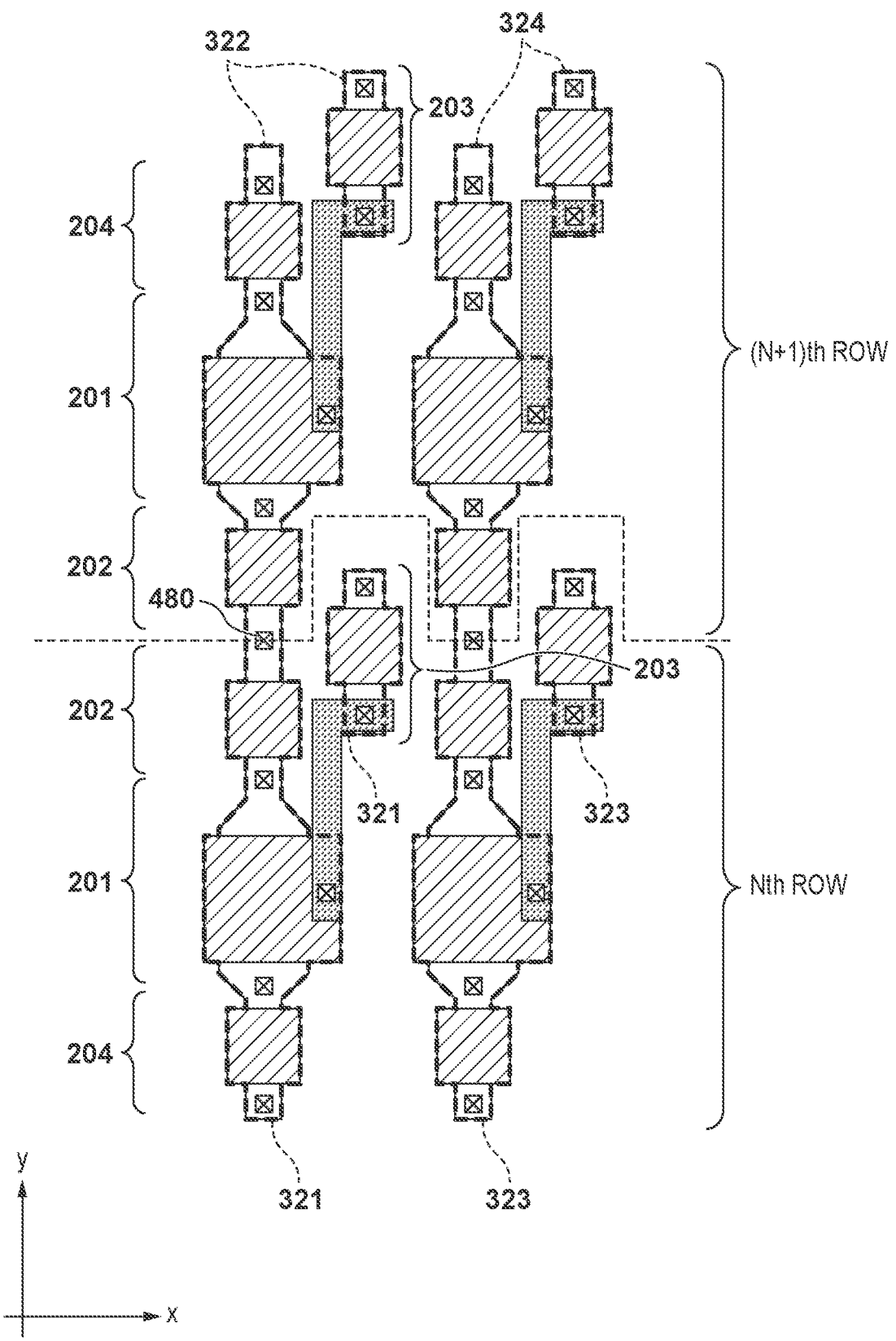
FIG. 7 is a plan view of the driving circuit of the pixel shown in FIG. 2.

FIG. 7 shows another modification for the arrangements of the driving circuit including the drive transistor 201, the light emission control transistor 202, the write transistor 203, and the reset transistor 204 shown in FIGS. 3 and 5. In the configuration shown in FIG. 7, transistor regions 321 to 324 are alternately arranged in mirror symmetry row by row.

In the configuration shown in FIG. 7, in the transistor region 321 of the Nth row, the light emission control transistor 202, the drive transistor 201, and the reset transistor 204 are arranged in this order from the side of the transistor region 322. On the other hand, in the transistor region 322 of the (N+1)th row, the light emission control transistor 202, the drive transistor 201, and the reset transistor 204 are arranged in this order from the side of the transistor region 321.

At this time, in the transistor regions (for example, the transistor region 321 and the transistor region 322) of the two pixels 102 adjacent to each other in the y direction, the source region of the light emission control transistor 202 in the transistor region 321 and the source region of the light emission control transistor 202 in the transistor region 322 may share one diffusion region 480. In this case, the boundary between the transistor region 321 and the transistor region 322 passes on the diffusion region 480. Hence, a virtual line parallel to the x direction, which passes through the source region of the light emission control transistor 202 in the transistor region 321 and the source region of the light emission control transistor 202 in the transistor region 322, passes through the gate electrode of the write transistor 203 in the transistor region 321.

Similarly, in the transistor regions of the two pixels 102 adjacent to each other in the y direction, the drain regions of the reset transistors 204 are also connected to the power supply voltage Vss of the same potential and may therefore share a diffusion region. In this case, the boundary between the transistor regions of the two pixels 102 adjacent to each other in the y direction passes on the shared diffusion region that functions as the drain regions of the reset transistors 204. Hence, a virtual line parallel to the x direction, which passes through source regions that share the diffusion regions of the light emission control transistor 202 in the transistor regions 321 of the two pixels 102 adjacent to each other in the y direction, passes through the gate electrode of the write transistor 203 in any one of the transistor regions.

In the configuration shown in FIG. 7, the driving circuits need not be insulated and isolated for each pixel 102, as shown in FIGS. 3 and 5. It is therefore possible to arrange the driving circuits more closely and increase the resolution of the light emitting device 101.

Figure 8:
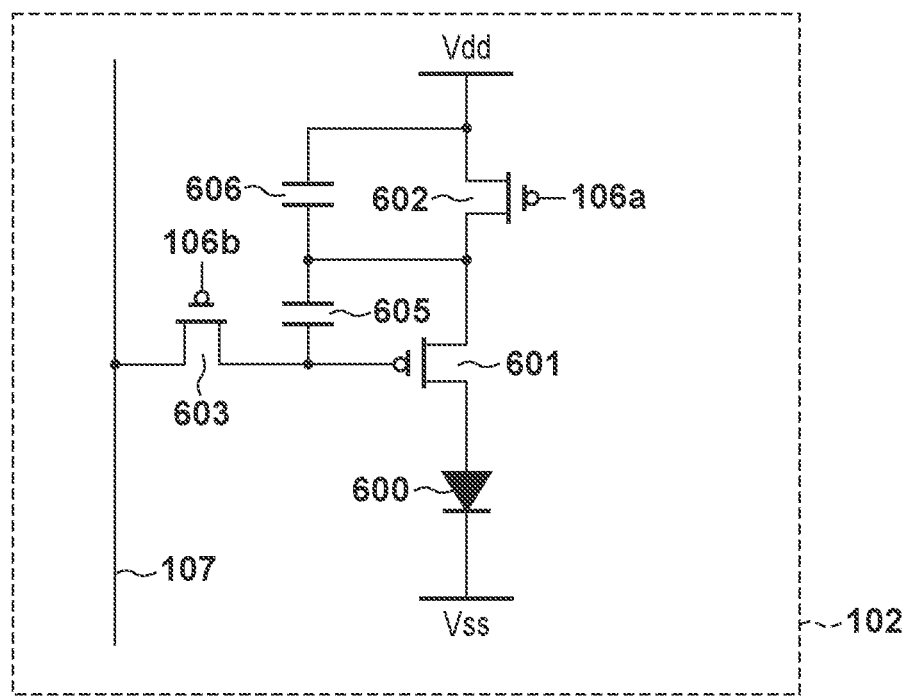
FIG. 8 is a circuit diagram of a pixel of the light emitting device shown in FIG. 1.

FIG. 8 is a view showing a modification of the driving circuit of the pixel 102 shown in FIG. 2. In the configuration shown in FIG. 8, the reset transistor 204 is not arranged as compared to the configuration shown in FIG. 2. The rest of the configuration may be the same as that shown in FIG. 2.

More specifically, the pixel 102 includes an organic EL element 600 as a light emitting element. In addition, the pixel 102 includes, as a driving circuit, three transistors including a drive transistor 601, a light emission control transistor 602, and a write transistor 603, and two electrostatic capacitors 605 and 606. The driving circuit is connected to the power supply potentials Vdd and Vss. The three transistors that form the driving circuit are p-type transistors. The control signal is input to the gate electrodes of the light emission control transistor 602 and the write transistor 603 via the two scan lines 106a and 106b, respectively.

The signal line 107 is connected to the drain region of the write transistor 603. When the write transistor 603 is turned on, the voltage value of the signal line 107 is input to the gate electrode of the drive transistor 601. Depending on the signal voltage, a current value flowing between the source terminal and the drain terminal of the drive transistor 601 is decided, and the light emission brightness of the organic EL element 600 is controlled. The drain terminal of the drive transistor 601 is electrically connected to the anode of the organic EL element 600. The power supply potential Vdd is +10 V based on the power supply potential Vss. Setting of these potentials is decided by the photoelectric conversion characteristic of the organic EL element 600 that is a light emitting element.

Figure 9:
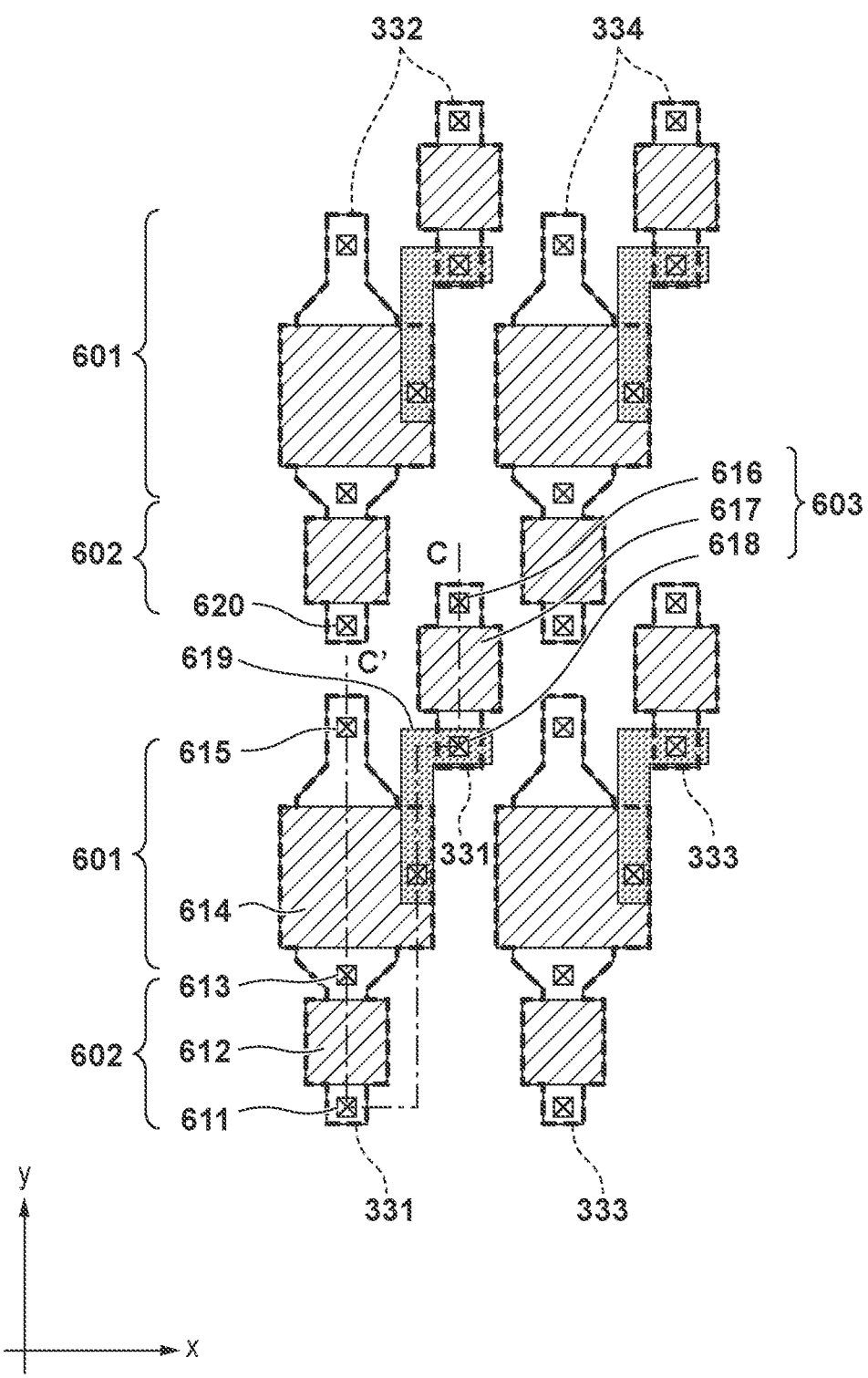
FIG. 9 is a plan view of the driving circuit of the pixel shown in FIG. 8.

FIG. 9 is a plan view showing the arrangement of the drive transistor 601, the light emission control transistor 602, and the write transistor 603, which form the driving circuit shown in FIG. 8, on the substrate. The source regions, the gate regions, and the drain regions of the light emission control transistor 602 and the drive transistor 601 are arranged on a line parallel to the y direction. A source region 616 and a drain region 618 of the write transistor 603 are isolated by an insulator from the light emission control transistor 602 and the drive transistor 601, and the source region 616, the gate region, and the drain region 618 are arranged in parallel to the y direction. In the circuit shown in FIG. 8, the drain region of the light emission control transistor 602 and the source region of the drive transistor 601 have the same potential, and these transistors are arranged as sharing nodes that share a single diffusion region 613, as shown in FIG. 9. The drain region of the write transistor 603 and the gate electrode of the drive transistor 601 are the same terminal on the circuit diagram of FIG. 8 and are therefore made conductive via a wiring pattern 619, as shown in FIG. 9. Since FIG. 9 is a plan view on the semiconductor substrate, connecting lines shown in the circuit diagram of FIG. 8 are not illustrated. A wiring layer is stacked on the transistors on the semiconductor substrate, and the circuit shown in FIG. 8 is implemented by wiring patterns and through vias.

Here, focus is placed on the transistor regions (for example, the transistor region 331 and the transistor region 332) corresponding to the two pixels 102 adjacent to each other in the y direction. In the configuration shown in FIG. 9, a virtual line parallel to the x direction, which passes through a drain region 620 of the light emission control transistor 602 arranged in the transistor region 332, passes through a gate electrode 617 of the write transistor 603 in the transistor region 331. Also, a virtual line parallel to the x direction, which passes through the gate electrode 617 of the write transistor 603 in the transistor region 331, does not pass through gate electrodes 612 and 613 of the transistors (the drive transistor 601 and the light emission control transistor 602) of the first group arranged in the transistor region 331. In addition, a virtual line parallel to the x direction, which passes through the gate electrode 617 of the write transistor 603 in the transistor region 331, does not pass through the gate electrodes of the transistors (the drive transistor 601 and the light emission control transistor 602) of the first group arranged in the transistor region 332. With this configuration, the driving circuits configured to drive the organic EL elements 600 that are light emitting elements can be arranged at a high density, as in the above-described configurations. This can increase the resolution of the light emitting device 101 in the configuration shown in FIG. 9 as well.

Figure 10:
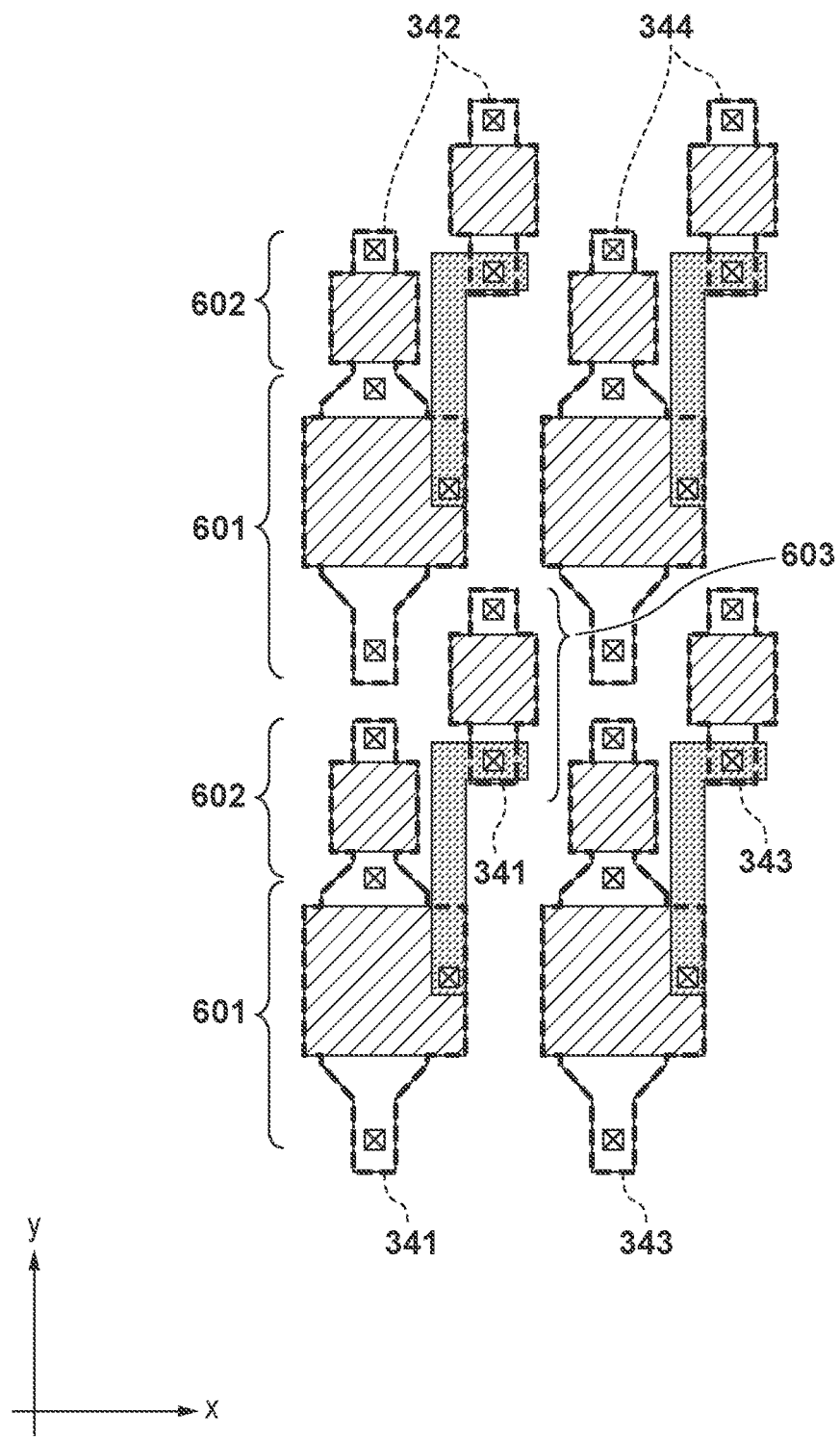
FIG. 10 is a plan view of the driving circuit of the pixel shown in FIG. 8.

FIG. 10 shows a modification for the arrangement of the driving circuit including the drive transistor 601, the light emission control transistor 602, and the write transistor 603 shown in FIG. 9. In the configuration shown in FIG. 9, in the transistor region 332, the light emission control transistor 602 and the drive transistor 601 are arranged in this order from the side of the transistor region 331. On the other hand, in the configuration shown in FIG. 10, in a transistor region 342, the drive transistor 601 and the light emission control transistor 602 are arranged in this order from the side of a transistor region 341. The reset of the configuration may be the same as that shown in FIG. 9, and a description thereof will be omitted here. In the configuration shown in FIG. 10 as well, it is possible to obtain the effect of increasing the density of driving circuits as in the configuration shown in FIG. 9 and consequently increase the resolution of the light emitting device 101.

In the configuration shown in FIG. 10, the drive transistor 601 and the light emission control transistor 602 are arranged at positions reversed from those in the configuration shown in FIG. 9. However, the present invention is not limited to this, and, for example, in the configuration shown in FIG. 10, the source region and the drain region of the write transistor 603 may be reversed. Similarly, in the configuration shown in FIG. 9 as well, the source region 616 and the drain region 618 of the write transistor 603 may be reversed.

Figure 11:
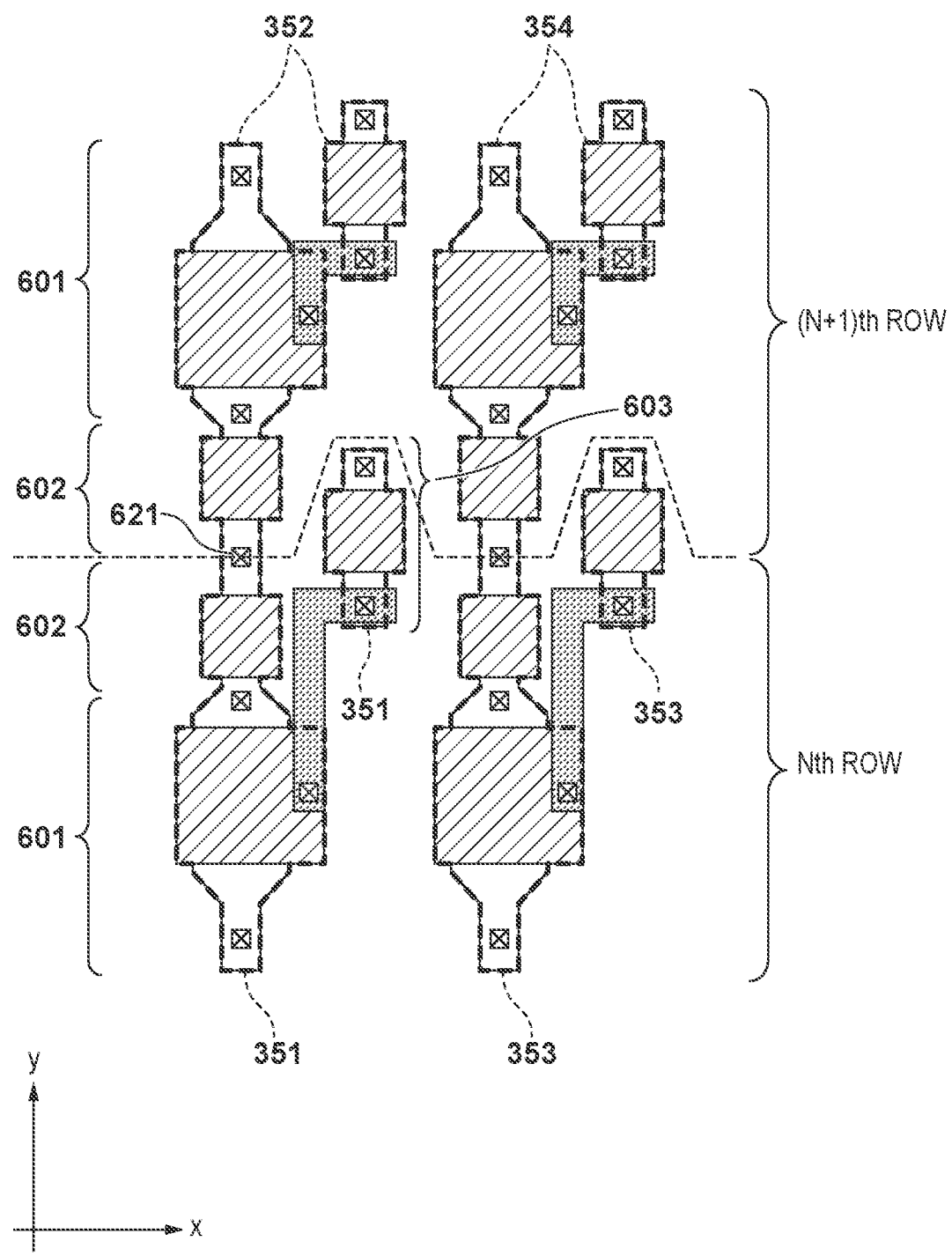
FIG. 11 is a plan view of the driving circuit of the pixel shown in FIG. 8.

FIG. 11 shows another modification for the arrangements of the driving circuit including the drive transistor 601, the light emission control transistor 602, and the write transistor 603 shown in FIGS. 9 and 10. In the configuration shown in FIG. 11, transistor regions 351 to 354 are alternately arranged in mirror symmetry row by row.

In the configuration shown in FIG. 11, in the transistor region 351 of the Nth row, the light emission control transistor 602 and the drive transistor 601 are arranged in this order from the side of the transistor region 352. On the other hand, in the transistor region 352 of the (N+1)th row, the light emission control transistor 602 and the drive transistor 601 are arranged in this order from the side of the transistor region 351.

At this time, in the transistor regions (for example, the transistor region 351 and the transistor region 352) of the two pixels 102 adjacent to each other in the y direction, the source region of the light emission control transistor 602 in the transistor region 351 and the source region of the light emission control transistor 602 in the transistor region 352 may share one diffusion region 621. In this case, the boundary between the transistor region 351 and the transistor region 352 passes on the diffusion region 621. Hence, a virtual line parallel to the x direction, which passes through the source region of the light emission control transistor 602 in the transistor region 351 and the source region of the light emission control transistor 602 in the transistor region 352, passes through the gate electrode of the write transistor 603 in the transistor region 351.

In the configuration shown in FIG. 11, the driving circuits need not be insulated and isolated for each pixel 102, as shown in FIGS. 9 and 10. It is therefore possible to arrange the driving circuits more closely and increase the resolution of the light emitting device 101.

Figure 12:
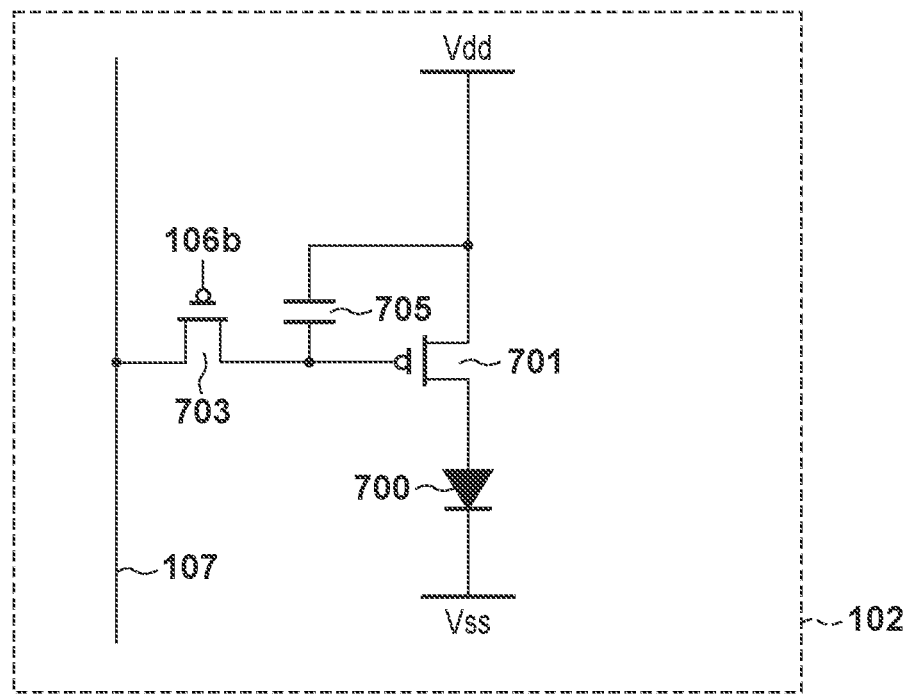
FIG. 12 is a circuit diagram of a pixel of the light emitting device shown in FIG. 1.

FIG. 12 is a view showing a modification of the driving circuit of the pixel 102 shown in FIGS. 2 and 8. In the configuration shown in FIG. 12, the light emission control transistor 202 and the reset transistor 204 are not arranged as compared to the configuration shown in FIG. 2. In addition, since the light emission control transistor 202 is not arranged, the electrostatic capacitor 206 is not arranged either. The rest of the configuration may be the same as that shown in FIG. 2.

More specifically, the pixel 102 includes an organic EL element 700 as a light emitting element. In addition, the pixel 102 includes, as a driving circuit, two transistors including a drive transistor 701 and a write transistor 703, and one electrostatic capacitor 705. The driving circuit is connected to the power supply potentials Vdd and Vss. The two transistors that form the driving circuit are p-type transistors. The control signal is input to the gate electrode of the write transistor 703 via the scan line 106b.

The signal line 107 is connected to the drain region of the write transistor 703. When the write transistor 703 is turned on, the voltage value of the signal line 107 is input to the gate electrode of the drive transistor 701. Depending on the signal voltage, a current value flowing between the source terminal and the drain terminal of the drive transistor 701 is decided, and the light emission brightness of the organic EL element 700 is controlled. The drain terminal of the drive transistor 701 is electrically connected to the anode terminal of the organic EL element 700. The power supply potential Vdd is +10 V based on the power supply potential Vss. Setting of these potentials is decided by the photoelectric conversion characteristic of the organic EL element 700 that is a light emitting element.

Figure 13:
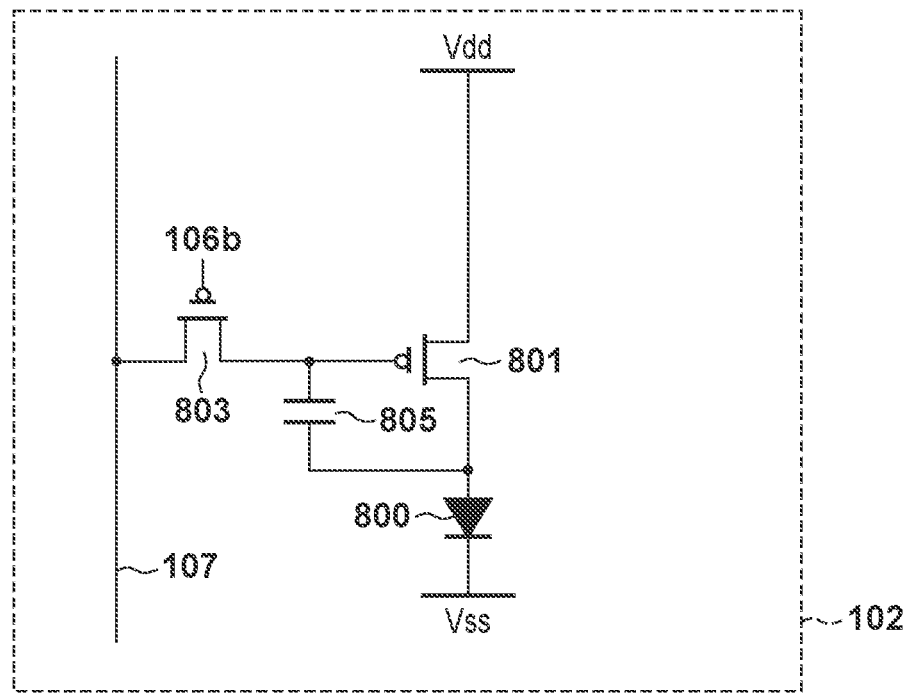
FIG. 13 is a circuit diagram of a pixel of the light emitting device shown in FIG. 1.

FIG. 13 is a modification of FIG. 12. In the above-described configurations, an example in which p-type transistors are used as the transistors used in the driving circuit of the pixel 102 has been shown. However, the present invention is not limited to this. FIG. 13 shows an example in which a drive transistor 801 and a write transistor 803 are formed by n-type transistors. Hence, an electrostatic capacitor 805 is connected between the gate and the source of the drive transistor 801. In the above-described configurations as well, n-type transistors may be used in place of p-type transistors.

Figure 14:
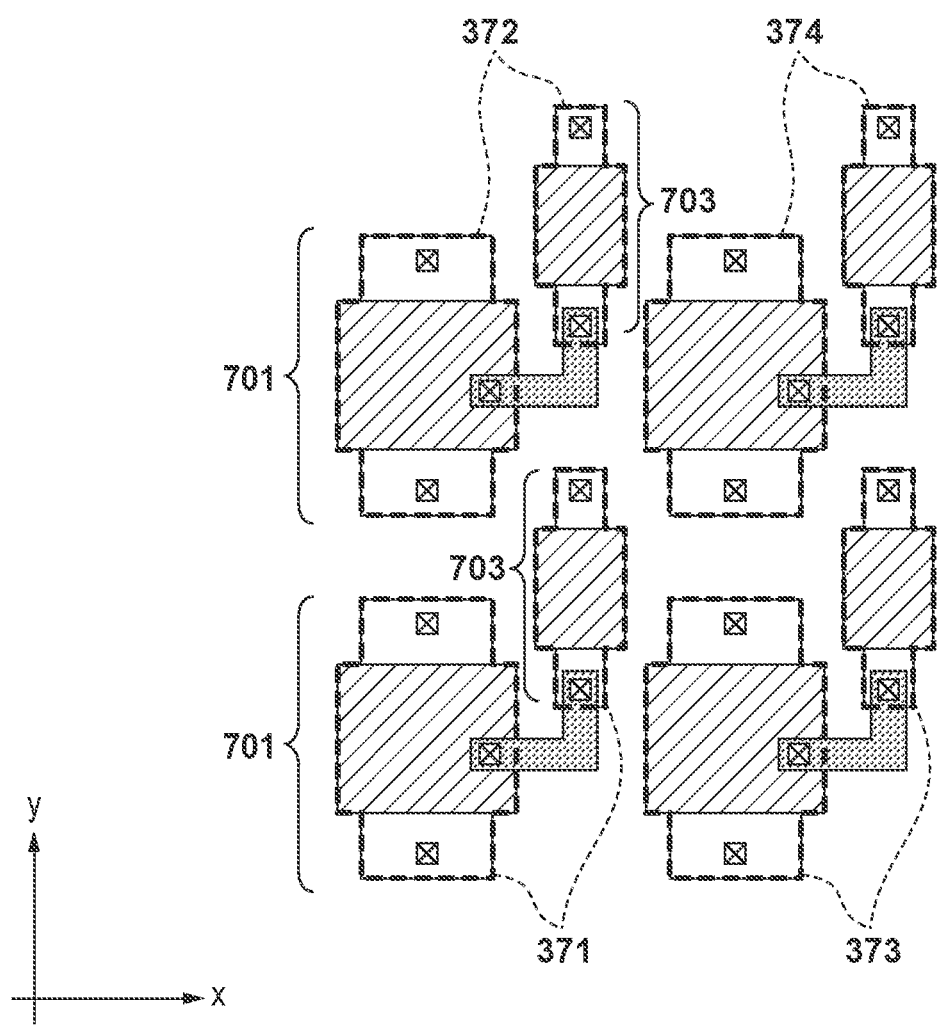
FIG. 14 is a plan view of the driving circuit of the pixel shown in FIG. 12.

FIG. 14 is a plan view showing the arrangement of the drive transistor 701 and the write transistor 703, which form the driving circuit shown in FIG. 12, on the substrate. FIG. 14 will be described in correspondence with the circuit diagram of FIG. 12. The arrangement of transistors can be the same as in the circuit diagram of FIG. 13 except the P-N polarity of the transistors. The source region, the gate region, and the drain region of the drive transistor 701 are arranged on a line parallel to the y direction. A source region and a drain region of the write transistor 703 are isolated by an insulator from the drive transistor 701, and the source region, the gate region, and the drain region are arranged in parallel to the y direction. The drain region of the write transistor 703 and the gate electrode of the drive transistor 701 are the same terminal on the circuit diagram of FIG. 12 and are therefore made conductive via a wiring pattern, as shown in FIG. 14. Since FIG. 14 is a plan view on the semiconductor substrate, connecting lines shown in the circuit diagram of FIG. 12 are not illustrated. A wiring layer is stacked on the transistors on the semiconductor substrate, and the circuit shown in FIG. 12 is implemented by wiring patterns and through vias.

Here, focus is placed on the transistor regions (for example, a transistor region 371 and the transistor region 372) corresponding to the two pixels 102 adjacent to each other in the y direction. In the configuration shown in FIG. 14, a virtual line parallel to the x direction, which passes through the drain region or the source region of the drive transistor 701 arranged in the transistor region 372, passes through the gate electrode of the write transistor 703 in the transistor region 371. Also, a virtual line parallel to the x direction, which passes through the gate electrode of the write transistor 703 in the transistor region 371, does not pass through gate electrode of the transistor (drive transistor 701) of the first group arranged in the transistor region 371. In addition, a virtual line parallel to the x direction, which passes through the gate electrode of the write transistor 703 in the transistor region 371, does not pass through the gate electrode of the transistor (drive transistor 701) of the first group arranged in the transistor region 372. With this configuration, the driving circuits configured to drive the organic EL elements 700 that are light emitting elements can be arranged at a high density, as in the above-described configurations. This can increase the resolution of the light emitting device 101 in the configuration shown in FIG. 14 as well.

Figure 15:
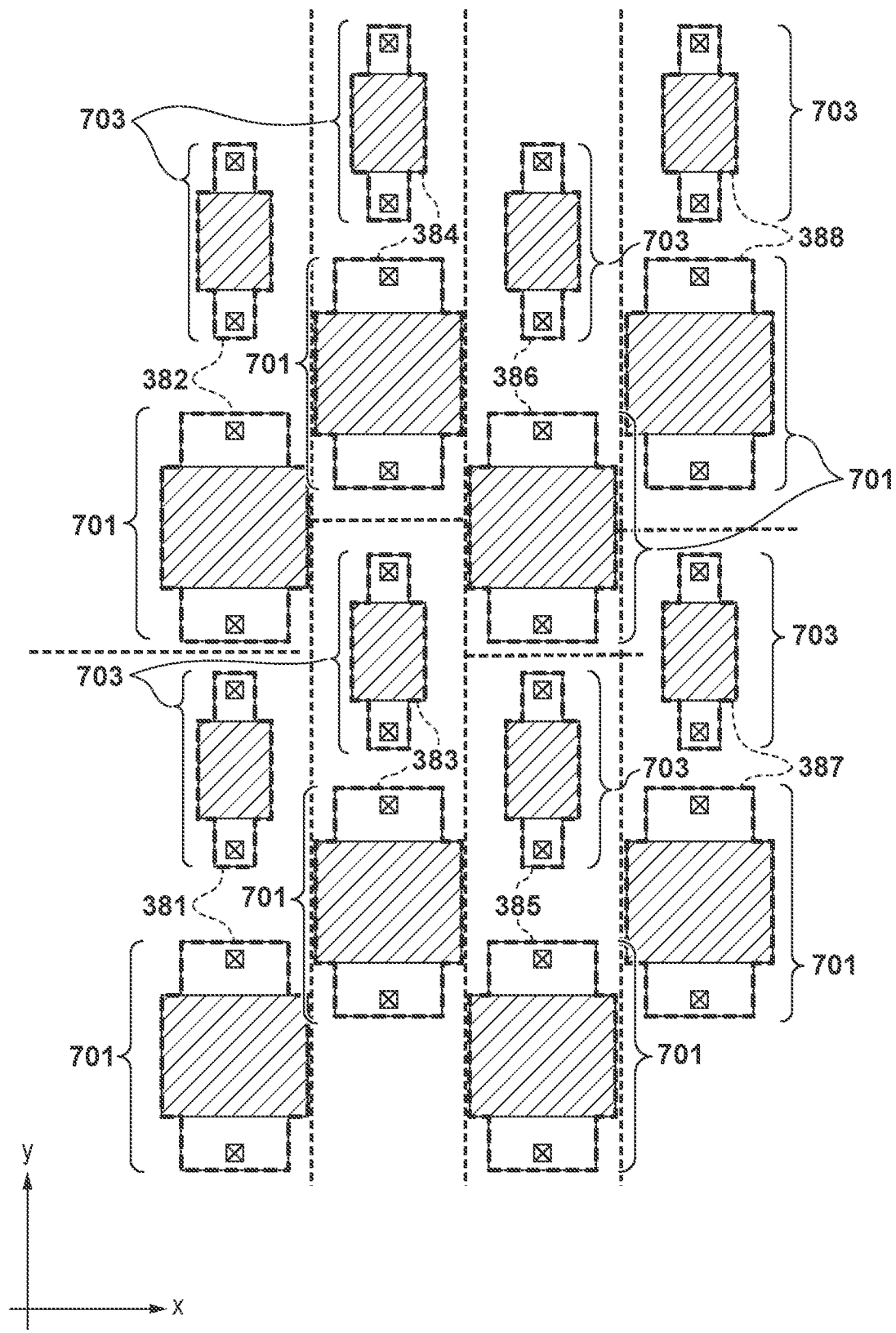
FIG. 15 is a plan view of the driving circuit of a pixel of the light emitting device shown in FIG. 1.

FIG. 15 is a plan view showing a modification of the arrangement of the drive transistor 701 and the write transistor 703, which form the driving circuit shown in FIG. 12, on the substrate. In the configuration shown in FIG. 15, the drive transistor 701 and the write transistor 703 are arranged on a line parallel to the y direction. In addition, the drive transistors 701 and the write transistors 703, which are adjacent to each other in the x direction, are alternately arranged in the y direction such that the gate terminals do not face each other.

Here, focus is placed on the transistor regions (for example, a transistor region 381 and a transistor region 382) corresponding to the two pixels 102 adjacent to each other in the y direction, and the transistor region (for example, a transistor region 383) corresponding to the two pixel 102 adjacent, in the x direction, to the two pixels 102 adjacent to each other in the y direction. At this time, a virtual line parallel to the x direction, which passes through the transistor region 383, passes through the transistor region 381 or the transistor region 382. Also, virtual lines parallel to the x direction, which pass through the gate electrodes of the plurality of transistors in the transistor region 383, do not pass through the gate electrode of the plurality of transistors in the transistor region 381 and the transistor region 382. Hence, the driving circuits can be arranged at a high density in both the x direction and the y direction. This can increase the resolution of the light emitting device 101 in the configuration shown in FIG. 15 as well.

Application examples in which the light emitting device 101 according to this embodiment is applied to a display device, a photoelectric conversion device, an electronic device, an illumination device, a moving body, and a wearable device will be described here with reference to FIGS. 16 to 22. Other application purposes of the light emitting device 101 are the exposure light source of an electrophotographic-type image forming apparatus, the backlight of a liquid crystal display device, a light emitting device including a color filter in a white light source, and the like. The display device may be an image information processing apparatus that includes an image input unit configured to input image information from an area CCD, a linear CCD, a memory card, or the like, and an information processing unit configured to process input information, and displays an input image on a display unit. A display unit provided in a camera or an inkjet printer may have a touch panel function. The driving method of the touch panel function may be an infrared method, an electrostatic capacity method, a low resistive film method, or an electromagnetic induction method, and is not particularly limited. In addition, the display device may be used for the display unit of a multi-function printer.

Figure 16:
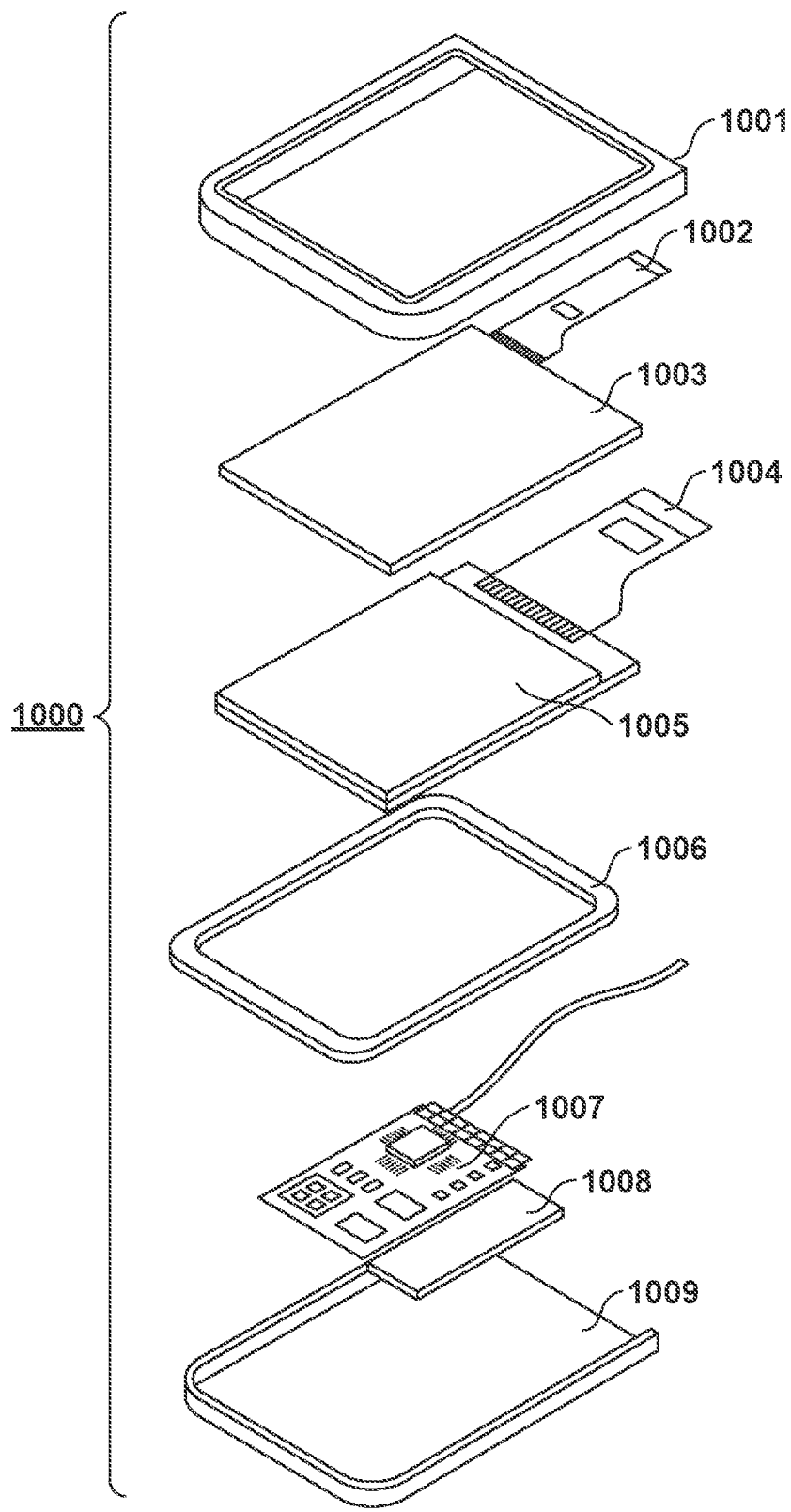
FIG. 16 is a view showing an example of a display device using the light emitting device shown in FIG. 1.

FIG. 16 is a schematic view showing an example of a display device using the light emitting device 101 according to this embodiment. A display device 1000 may include, between an upper cover 1001 and a lower cover 1009, a touch panel 1003, a display panel 1005, a frame 1006, a circuit board 1007, and a battery 1008. Flexible printed circuits FPC 1002 and 1004 are connected to the touch panel 1003 and the display panel 1005, respectively. Active elements such as transistors are arranged on the circuit board 1007. The battery 1008 may not be provided if the display device 1000 is not a portable apparatus, and need not always be provided at this position even if the display device 1000 is a portable apparatus. The above-described light emitting device 101 can be applied to the display panel 1005. The light emitting device 101 functioning as the display panel 1005 is connected to an active element such as a transistor arranged on the circuit board 1007 and operates.

The display device 1000 shown in FIG. 16 may be used for the display unit of a photoelectric conversion device (image capturing device) that includes an optical unit including a plurality of lenses, and an image capturing element configured to receive light that has passed through the optical unit and photoelectrically convert it into an electrical signal. The photoelectric conversion device may include a display unit configured to display information acquired by the image capturing element. Also, the display unit may be a display unit exposed to the outside of the photoelectric conversion device or may be a display unit arranged in a viewfinder. The photoelectric conversion device may be a digital camera or a digital video camera.

Figure 17:
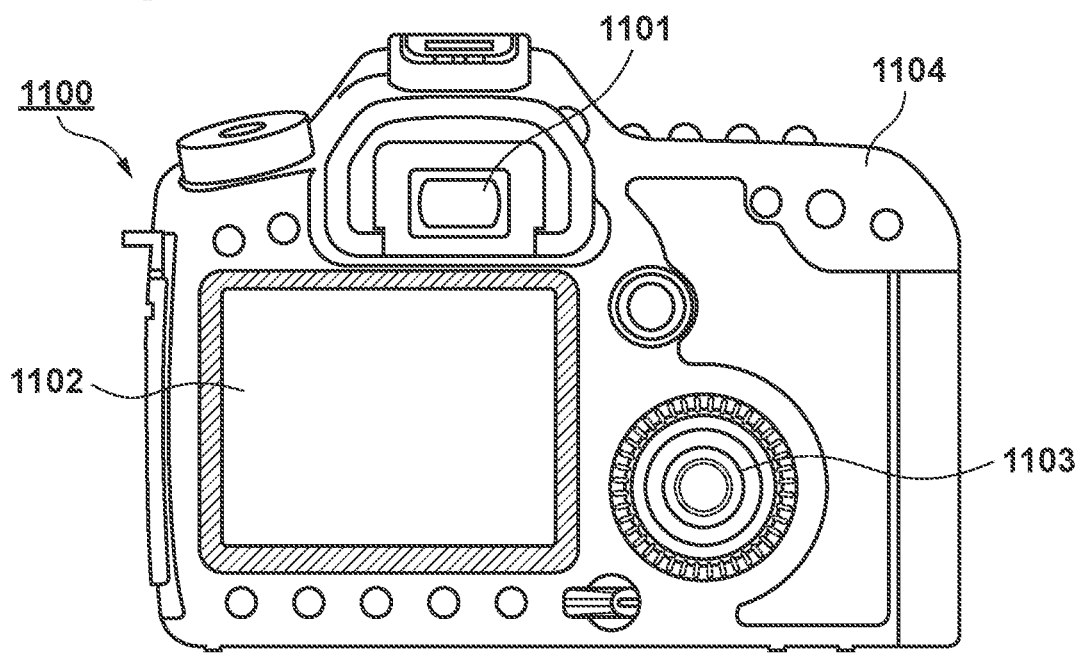
FIG. 17 is a view showing an example of a photoelectric conversion device using the light emitting device shown in FIG. 1.

FIG. 17 is a schematic view showing an example of a photoelectric conversion device using the light emitting device 101 according to this embodiment. A photoelectric conversion device 1100 may include a viewfinder 1101, a back display 1102, an operation unit 1103, and a housing 1104. The photoelectric conversion device 1100 can also be called an image capturing device. The above-described light emitting device 101 can be applied to the viewfinder 1101 that is a display unit. In this case, the light emitting device 101 may display not only a captured image but also environment information, an image capturing instruction, and the like. The environment information may include the intensity of external light, the direction of external light, the moving speed of an object, and the possibility that the object is shielded by a shielding object.

Since the timing suitable for image capturing is often a very short time, information should be displayed as soon as possible. Hence, the light emitting device 101 including an organic light emission material such as the organic EL element 200 as a light emitting element can be used for the viewfinder 1101. This is because the organic light emission material has a high response speed. The light emitting device 101 using the organic light emission material can be used for these devices, which require a display speed, more suitably than a liquid crystal display device.

The photoelectric conversion device 1100 includes an optical unit (not shown). The optical unit includes a plurality of lenses, and forms an image on a photoelectric conversion element (not shown) stored in the housing 1104 and configured to receive light that has passed through the optical unit. The plurality of lenses can adjust the focal point by adjusting their relative positions. This operation can be automatically performed.

The light emitting device 101 may be applied to the display unit of an electronic device. At this time, it may have both a display function and an operation function. As a portable terminal, a portable telephone such as a smartphone, a tablet, a head-mounted display, or the like can be used.

Figure 18:
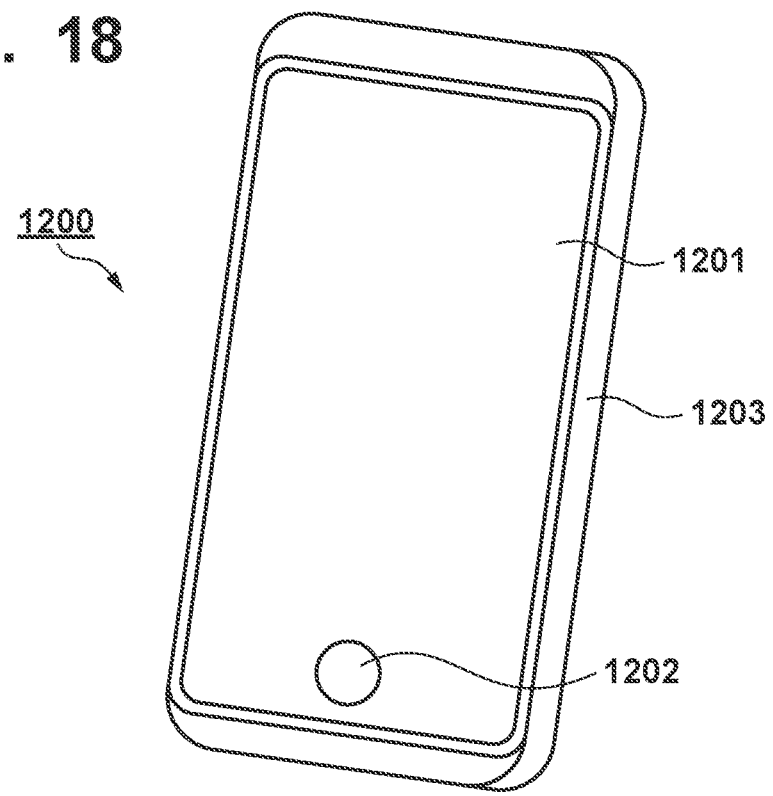
FIG. 18 is a view showing an example of an electronic device using the light emitting device shown in FIG. 1.

FIG. 18 is a schematic view showing an example of an electronic device using the light emitting device 101 according to this embodiment. An electronic device 1200 includes a display unit 1201, an operation unit 1202, and a housing 1203. The housing 1203 may include a circuit, a printed board including the circuit, a battery, and a communication unit. The operation unit 1202 may be a button, or a touch panel type reaction portion. The operation unit 1202 may be a living body recognition unit that recognizes a fingerprint and performs unlock or the like. The portable device including a communication unit can also be regarded as a communication apparatus. The above-described light emitting device 101 can be applied to the display unit 1201.

Figure 19A:
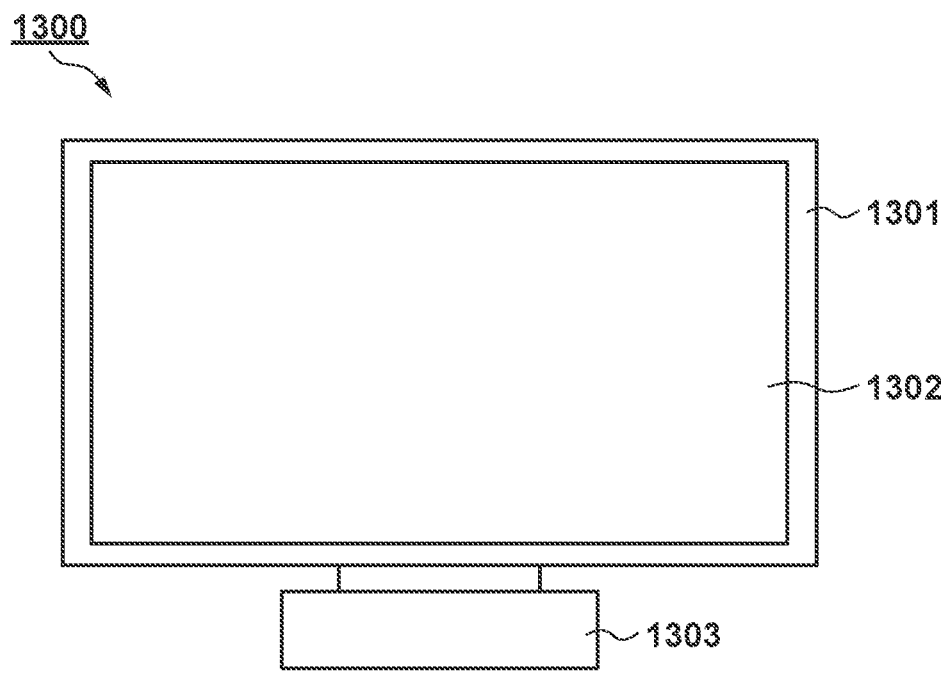
FIGS. 19A and 19B are views each showing an example of a display device using the light emitting device shown in FIG. 1.
Figure 19B:
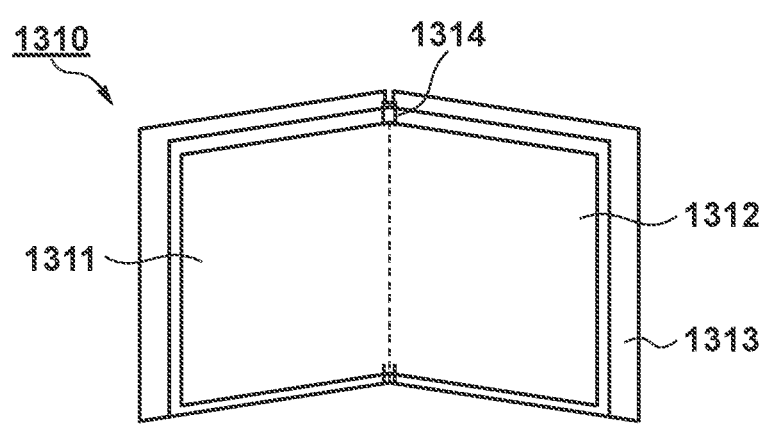

FIGS. 19A and 19B are schematic views showing examples of a display device using the light emitting device 101 according to this embodiment. FIG. 19A shows a display device such as a TV monitor or a PC monitor. A display device 1300 includes a frame 1301 and a display unit 1302. The above-described light emitting device 101 can be applied to the display unit 1302. The display device 1300 may include a base 1303 that supports the frame 1301 and the display unit 1302. The base 1303 is not limited to the form shown in FIG. 19A. For example, the lower side of the frame 1301 may serve as the base 1303. The frame 1301 and the display unit 1302 may be curved. The radius of curvature may be 5,000 mm (inclusive) to 6,000 mm (inclusive).

FIG. 19B is a schematic view showing another example of the display device using the light emitting device 101 according to this embodiment. A display device 1310 shown in FIG. 19B is configured to be foldable, and is a so-called foldable display device. The display device 1310 includes a first display unit 1311, a second display unit 1312, a housing 1313, and a bending point 1314. The above-described light emitting device 101 can be applied to the first display unit 1311 and the second display unit 1312. The first display unit 1311 and the second display unit 1312 may be one jointless display device. The first display unit 1311 and the second display unit 1312 can be separated at the bending point. The first display unit 1311 and the second display unit 1312 may display different images, or one image may be displayed by the first and second display units.

Figure 20:
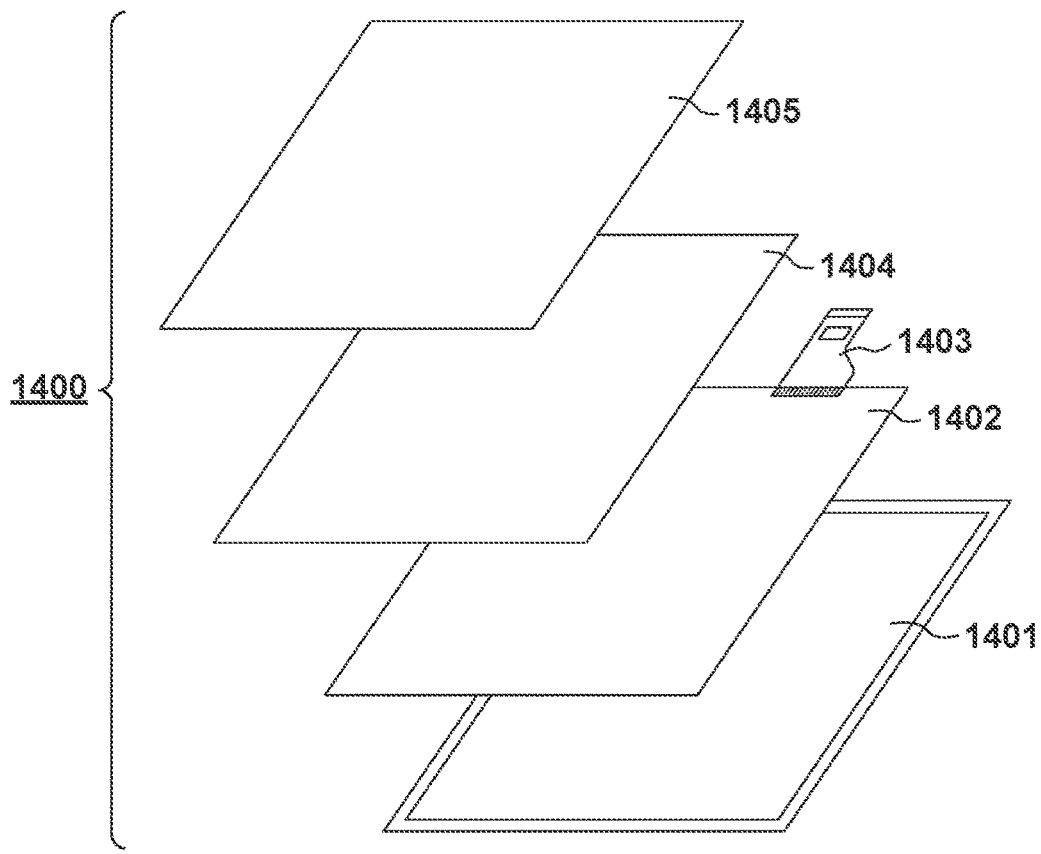
FIG. 20 is a view showing an example of an illumination device using the light emitting device shown in FIG. 1.

FIG. 20 is a schematic view showing an example of an illumination device using the light emitting device 101 according to this embodiment. An illumination device 1400 may include a housing 1401, a light source 1402, a circuit board 1403, an optical film 1404, and a light diffusing portion 1405. The above-described light emitting device 101 can be applied to the light source 1402. The optical film 1404 may be a filter that improves the color rendering property of the light source. The light diffusing portion 1405 can effectively diffuse light of the light source and send the light to a wide range in illumination or the like. A cover may be provided on the outermost portion, as needed. The illumination device 1400 may include both the optical film 1404 and the light diffusing portion 1405 or may include only one of them.

The illumination device 1400 is, for example, a device that illuminates the inside of a room. The illumination device 1400 may emit any one of a white color, a daytime white color, and blue to red colors. A light control circuit that controls the light may be provided. The illumination device 1400 may include a power supply circuit connected to the light emitting device 101 that functions as the light source 1402. The power supply circuit is a circuit that converts an AC voltage into a DC voltage. A white color has a color temperature of 4,200 K, and the daytime white color has a color temperature of 5,000 K. The illumination device 1400 may include a color filter. The illumination device 1400 may include a heat dissipation unit. The heat dissipation unit dissipates heat to the outside of the device, and a metal with a high specific heat, liquid silicone, or the like can be used.

Figure 21:
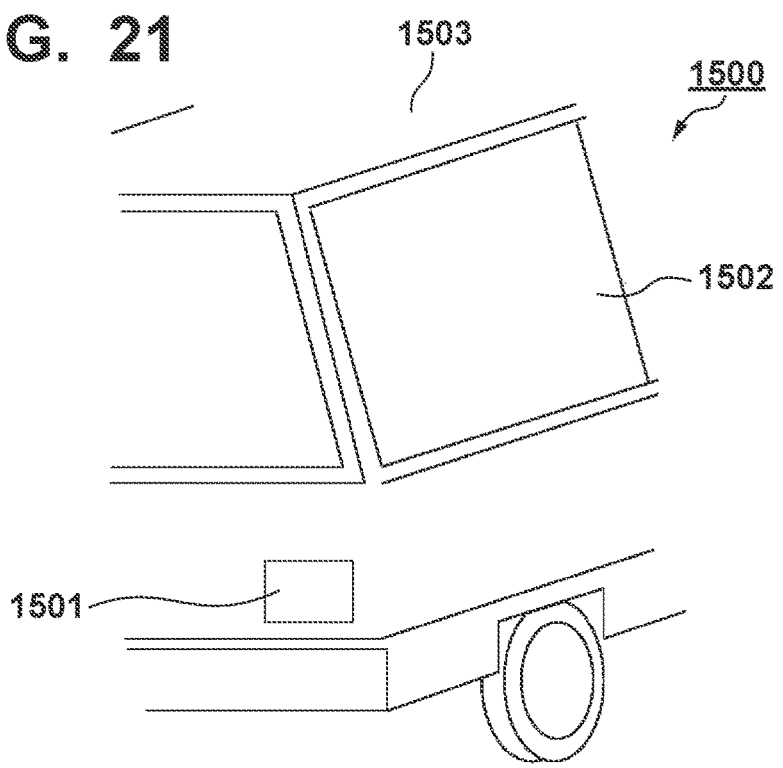
FIG. 21 is a view showing an example of a moving body using the light emitting device shown in FIG. 1.

FIG. 21 is a schematic view of an automobile including a tail lamp as an example of a vehicle lighting tool using the light emitting device 101 according to this embodiment. An automobile 1500 includes a tail lamp 1501, and may have a form to turn on the tail lamp 1501 when performing a brake operation or the like. The light emitting device 101 according to this embodiment may be used for a head lamp as a vehicle lighting tool. The automobile may be an example of a moving body, and the moving body may be a ship, a drone, an airplane, a railway vehicle or the like. The moving body may include an airframe, and a lighting tool provided on the airframe. The lighting tool may notify the current position of the airframe.

As the tail lamp 1501, the above-described light emitting device 101 can be applied. The tail lamp 1501 may include a protective member that protects the light emitting device 101 functioning as the tail lamp 1501. The protective member has a strength to a certain extent. The protective member can be made of any material if it is transparent, and may be made of polycarbonate or the like. Also, for the protective member, a furandicarboxylic acid derivative, an acrylonitrile derivative or the like may be mixed into polycarbonate.

The automobile 1500 may include a vehicle body 1503 and a window 1502 attached to that. The window may be a window used to confirm the front and rear of the automobile, or may be a transparent display. As the transparent display, the above-described light emitting device 101 functioning as a light emitting device, in which the light emitting layer of an organic layer 305 contains an organic light emission material, may be used. In this case, constituent materials such as electrodes provided in the light emitting device 101 are formed by transparent members.

Other application examples of the light emitting device 101 according to the above-described embodiments will be described with reference to FIGS. 22A and 22B. The light emitting device 101 can be applied to a system that can be attached as, for example, a wearable device such as smartglasses, an HMD, or a smart contact lens. An image capturing display device used in such an application example includes an image capturing device capable of photoelectrically converting visible light, and a light emitting device capable of emitting visible light.

Figure 22A:
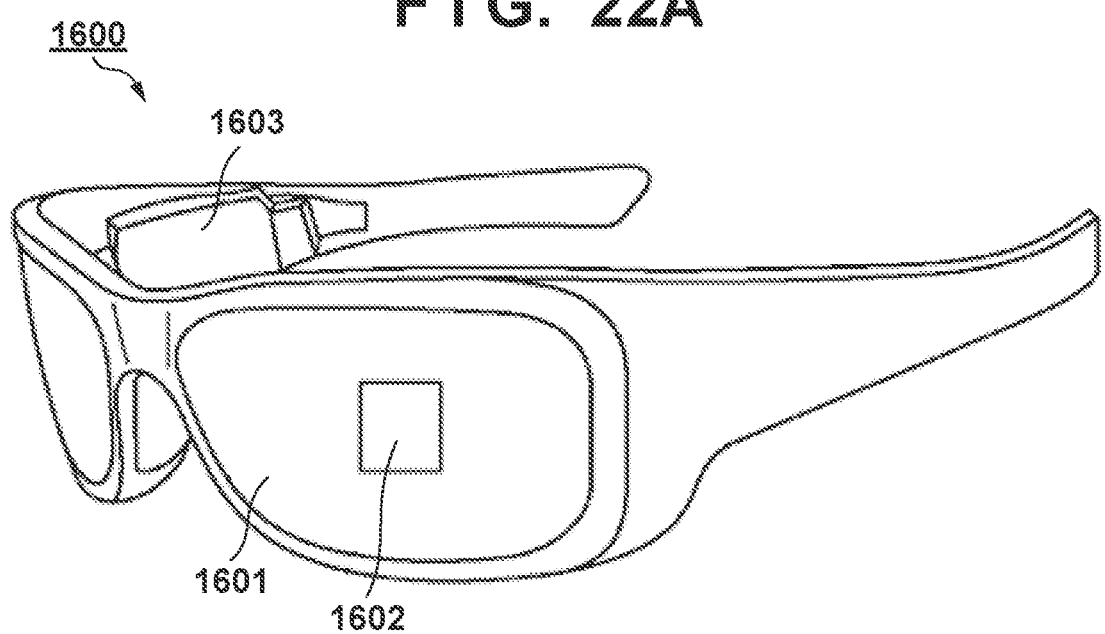
FIGS. 22A and 22B are views each showing an example of a wearable device using the light emitting device shown in FIG. 1.

FIG. 22A explains glasses 1600 (smartglasses) according to an application example. An image capturing device 1602 such as a CMOS sensor or an SPAD is provided on the surface side of a lens 1601 of the glasses 1600. In addition, the light emitting device 101 according to the above-described embodiments is provided on the back surface side of the lens 1601.

The glasses 1600 further includes a control device 1603. The control device 1603 functions as a power supply that supplies power to the image capturing device 1602 and the light emitting device 101 according to each embodiment. In addition, the control device 1603 controls the operations of the image capturing device 1602 and the light emitting device 101. An optical system configured to condense light to the image capturing device 1602 is formed on the lens 1601.

Figure 22B:
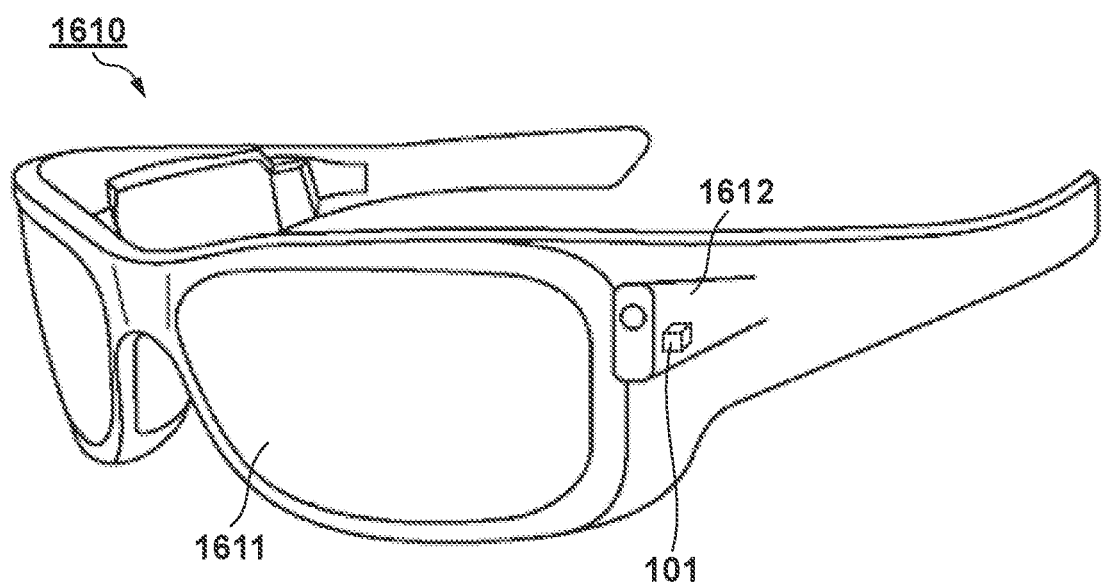

FIG. 22B explains glasses 1610 (smartglasses) according to an application example. The glasses 1610 include a control device 1612, and an image capturing device corresponding to the image capturing device 1602 and the light emitting device 101 are mounted in the control device 1612. The image capturing device in the control device 1612 and an optical system configured to project light emitted from the light emitting device 101 are formed in a lens 1611, and an image is projected to the lens 1611. The control device 1612 functions as a power supply that supplies power to the image capturing device and the light emitting device 101, and controls the operations of the image capturing device and the light emitting device 101. The control device 1612 may include line-of-sight detection unit that detects the line of sight of a wearer. The detection of a line of sight may be done using infrared rays. An infrared ray emitting unit emits infrared rays to an eyeball of the user who is gazing at a displayed image. An image capturing unit including a light receiving element detects reflected light of the emitted infrared rays from the eyeball, thereby obtaining a captured image of the eyeball. A reduction means for reducing light from the infrared ray emitting unit to the display unit in a planar view is provided, thereby reducing deterioration of image quality.

The line of sight of the user to the displayed image is detected from the captured image of the eyeball obtained by capturing the infrared rays. An arbitrary known method can be applied to the line-of-sight detection using the captured image of the eyeball. As an example, a line-of-sight detection method based on a Purkinje image obtained by reflection of irradiation light by a cornea can be used.

More specifically, line-of-sight detection processing based on pupil center corneal reflection is performed. Using pupil center corneal reflection, a line-of-sight vector representing the direction (rotation angle) of the eyeball is calculated based on the image of the pupil and the Purkinje image included in the captured image of the eyeball, thereby detecting the line-of-sight of the user.

The light emitting device 101 according to an embodiment of the present invention may include an image capturing device including a light receiving element, and a displayed image may be controlled based on the line-of-sight information of the user from the image capturing device.

More specifically, the light emitting device 101 decides a first visual field region at which the user is gazing and a second visual field region other than the first visual field region based on the line-of-sight information. The first visual field region and the second visual field region may be decided by the control device of the light emitting device 101, or those decided by an external control device may be received. In the display region of the light emitting device 101, the display resolution of the first visual field region may be controlled to be higher than the display resolution of the second visual field region. That is, the resolution of the second visual field region may be lower than that of the first visual field region.

In addition, the display region includes a first display region and a second display region different from the first display region, and a region of higher priority is decided from the first display region and the second display region based on line-of-sight information. The first display region and the second display region may be decided by the control device of the light emitting device 101, or those decided by an external control device may be received. The resolution of the region of higher priority may be controlled to be higher than the resolution of the region other than the region of higher priority. That is, the resolution of the region of relatively low priority may be set low.

Note that AI may be used to decide the first visual field region or the region of higher priority. The AI may be a model configured to estimate the angle of the line of sight and the distance to a target beyond the line of sight from the image of the eyeball using the image of the eyeball and the direction of actual viewing of the eyeball in the image as supervised data. The AI program may be held by the light emitting device 101, the image capturing device, or an external device. If the external device holds the AI program, it is transmitted to the light emitting device 101 via communication.

When performing display control based on line-of-sight detection, the light emitting device 101 can be applied to smartglasses further including an image capturing device configured to capture the outside. The smartglasses can display captured outside information in real time.

According to the present invention, it is possible to provide a technique advantageous in improving a resolution in a light emitting device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-097831, filed Jun. 4, 2020 which is hereby incorporated by reference herein in its entirety.

What is claimed is:

1. A light emitting device comprising a plurality of pixels arranged on a substrate to form a plurality of columns parallel to a first direction and a plurality of rows parallel to a second direction that is orthogonal to the first direction, wherein each of the plurality of pixels includes a light emitting element and a driving circuit configured to drive the light emitting element, wherein the substrate includes a transistor region in which a plurality of transistors that form the driving circuit are arranged, wherein the plurality of pixels includes a first pixel and a second pixel, which are adjacent to each other in the first direction, wherein a virtual line parallel to the second direction, which passes through the transistor region of the first pixel, passes through the transistor region of the second pixel, wherein the plurality of transistors forms a first group and a second group, each of which includes at least one transistor, wherein, in the plurality of transistors, a transistor of the first group has a source region, a gate region, and a drain region that are arranged along a first group virtual line that is parallel to the first direction, wherein, in the plurality of transistors, a transistor of the second group has a source region, a gate region, and a drain region that are arranged along a second group virtual line that is parallel to the first group virtual line, wherein, in the plurality of pixels, a virtual line parallel to the second direction, which passes through a gate electrode of the transistor of the first group of the plurality of transistors, does not pass through a gate electrode of the transistor of the second group in the plurality of transistors, wherein the plurality of transistors includes a first transistor included in the first group and a second transistor included in the second group, wherein a gate electrode of the first transistor and a drain region of the second transistor are electrically connected, wherein a drain region of the first transistor and an anode of the light emitting element are electrically connected, wherein the plurality of transistors further includes a third transistor included in the first group, wherein the third transistor has a drain region electrically connected to a source region of the first transistor, and the third transistor controls one of light emission and non-light emission of the light emitting element, and wherein a virtual line parallel to the second direction, which passes through a source region of the third transistor of the first pixel, passes through a gate electrode of the second transistor of the second pixel.

2. The device according to claim 1, wherein a pitch of the pixels arranged in the first direction in the plurality of pixels is wider than a pitch of the pixels arranged in the second direction in the plurality of pixels.

3. The device according to claim 1, wherein a virtual line parallel to the second direction, which passes through the transistor of the first group of the plurality of transistors of the first pixel, passes through the transistor of the second group in the plurality of transistors of the second pixel.

4. The device according to claim 1, wherein a virtual line parallel to the second direction, which passes through a gate electrode of the transistor of the first group of the plurality of transistors of the first pixel, does not pass through a gate electrode of the transistor of the second group in the plurality of transistors of the second pixel.

5. The device according to claim 1, wherein a source region of the third transistor of the first pixel and a source region of the third transistor of the second pixel share one diffusion region.

6. The device according to claim 1, wherein the plurality of transistors further includes a fourth transistor included in the first group, and
   wherein the fourth transistor has a source region electrically connected to the drain region of the first transistor and the anode of the light emitting element, and the fourth transistor resets the light emitting element.

7. The device according to claim 6, wherein the drain region of the fourth transistor of the first pixel and a drain region of the fourth transistor of the second pixel share one diffusion region.

8. The device according to claim 7, wherein virtual lines that are parallel to the second direction, which pass through the drain region of the fourth transistor of the first pixel and the drain region of the fourth transistor of the second pixel, pass through a gate electrode of the second transistor of the second pixel.

9. The device according to claim 1, wherein a virtual line that is parallel to the second direction, which passes through a drain region of the third transistor of the first pixel, passes through a gate electrode of the second transistor of the second pixel.

10. The device according to claim 1, wherein the plurality of pixels further includes a third pixel adjacent to the first pixel in the second direction, and
    wherein the transistor region of the third pixel is arranged at a position where the transistor region of the first pixel is translated in the second direction.

11. The device according to claim 1, wherein on an orthogonal projection to the substrate, the transistor region is a region occupied by an active region, a source region, a drain region, and a gate electrode of each of the plurality of transistors.

12. A display device comprising a light emitting device as defined in claim 1, and an active element connected to the light emitting device.

13. A photoelectric conversion device comprising an optical unit including a plurality of lenses, an image capturing element configured to receive light that has passed through the optical unit, and a display unit configured to display an image,
    wherein the display unit is a display unit configured to display an image captured by the image capturing element and includes a light emitting device as defined in claim 1.

14. An electronic device comprising a housing provided with a display unit and a communication unit provided in the housing, the communication unit being configured to communicate with outside of the electronic device,
    wherein the display unit includes a light emitting device as defined in claim 1.

15. A wearable device comprising a display device configured to display an image,
    wherein the display device includes a light emitting device as defined in claim 1.

16. A light emitting device comprising a plurality of pixels arranged on a substrate to form a plurality of columns parallel to a first direction and a plurality of rows parallel to a second direction that is orthogonal to the first direction,
    wherein each of the plurality of pixels includes a light emitting element and a driving circuit configured to drive the light emitting element,
    wherein the substrate includes a transistor region in which a plurality of transistors that form the driving circuit are arranged,
    wherein the plurality of pixels includes a first pixel and a second pixel, which are adjacent to each other in the first direction,
    wherein a virtual line parallel to the second direction, which passes through the transistor region of the first pixel, passes through the transistor region of the second pixel,
    wherein the plurality of transistors forms a first group and a second group, each of which includes at least one transistor,
    wherein, in the plurality of transistors, a transistor of the first group has a source region, a gate region, and a drain region that are arranged along a first group virtual line that is parallel to the first direction,
    wherein, in the plurality of transistors, a transistor of the second group has a source region, a gate region, and a drain region that are arranged along a second group virtual line that is parallel to the first group virtual line,
    wherein in each of the plurality of pixels, a virtual line that is parallel to the second direction, which passes through a gate electrode of the transistor of the first group of the plurality of transistors, does not pass through a gate electrode of the transistor of the second group in the plurality of transistors,
    wherein the plurality of transistors includes a first transistor included in the first group and a second transistor included in the second group,
    wherein a gate electrode of the first transistor and a drain region of the second transistor are electrically connected,
    wherein a drain region of the first transistor and an anode of the light emitting element are electrically connected,
    wherein the plurality of transistors further includes a third transistor included in the first group,
    wherein the third transistor has a drain region electrically connected to a source region of the first transistor, and the third transistor controls one of light emission and non-light emission of the light emitting element,
    wherein a source region of the third transistor of the first pixel and a source region of the third transistor of the second pixel share one diffusion region, and
    wherein virtual lines parallel to the second direction, which pass through the source region of the third transistor of the first pixel and the source region of the third transistor of the second pixel, pass through a gate electrode of the second transistor of the second pixel.

17. A display device comprising a light emitting device as defined in claim 16, and an active element connected to the light emitting device.

18. A photoelectric conversion device comprising an optical unit including a plurality of lenses, an image capturing element configured to receive light that has passed through the optical unit, and a display unit configured to display an image,
    wherein the display unit is a display unit configured to display an image captured by the image capturing element and includes a light emitting device as defined in claim 16.

19. An electronic device comprising a housing provided with a display unit and a communication unit provided in the housing, the communication unit being configured to communicate with outside of the electronic device,
wherein the display unit includes a light emitting device as defined in claim 16.

20. A wearable device comprising a display device configured to display an image, wherein the display device includes a light emitting device as defined in claim 16.

21. A light emitting device comprising a plurality of pixels arranged on a substrate to form a plurality of columns parallel to a first direction and a plurality of rows parallel to a second direction that is orthogonal to the first direction,
wherein each of the plurality of pixels includes a light emitting element and a driving circuit configured to drive the light emitting element,
wherein the substrate includes a transistor region in which a plurality of transistors that form the driving circuit are arranged,
wherein the plurality of pixels includes a first pixel and a second pixel, which are adjacent to each other in the first direction,
wherein a virtual line parallel to the second direction, which passes through the transistor region of the first pixel, passes through the transistor region of the second pixel,
wherein the plurality of transistors forms a first group and a second group, each of which includes at least one transistor,
wherein, in the plurality of transistors, a transistor of the first group has a source region, a gate region, and a drain region that are arranged along a first group virtual line that is parallel to the first direction,
wherein, in the plurality of transistors, a transistor of the second group has a source region, a gate region, and a drain region that are arranged along a second group virtual line that is parallel to the first group virtual line,
wherein, in each of the plurality of pixels, a virtual line that is parallel to the second direction, which passes through a gate electrode of the transistor of the first group in the plurality of transistors, does not pass through a gate electrode of the transistor of the second group in the plurality of transistors,
wherein the plurality of transistors includes a first transistor included in the first group and a second transistor included in the second group,
wherein a gate electrode of the first transistor and a drain region of the second transistor are electrically connected,
wherein a drain region of the first transistor and an anode of the light emitting element are electrically connected,
wherein the plurality of transistors further includes a third transistor included in the first group,
wherein the third transistor has a drain region electrically connected to a source region of the first transistor, and the third transistor controls one of light emission and non-light emission of the light emitting element,
wherein the plurality of transistors further includes a fourth transistor included in the first group,
wherein the fourth transistor has a source region electrically connected to the drain region of the first transistor and the anode of the light emitting element, and the fourth transistor resets the light emitting element, and
wherein a virtual line that is parallel to the second direction, which passes through a drain region of the fourth transistor of the first pixel, passes through a gate electrode of the second transistor of the second pixel.

22. A display device comprising a light emitting device as defined in claim 21, and an active element connected to the light emitting device.

23. A photoelectric conversion device comprising an optical unit including a plurality of lenses, an image capturing element configured to receive light that has passed through the optical unit, and a display unit configured to display an image,
wherein the display unit is a display unit configured to display an image captured by the image capturing element and includes a light emitting device as defined in claim 21.

24. An electronic device comprising a housing provided with a display unit and a communication unit provided in the housing, the communication unit being configured to communicate with outside of the electronic device,
wherein the display unit includes a light emitting device as defined in claim 21.

25. A wearable device comprising a display device configured to display an image, wherein the display device includes a light emitting device as defined in claim 21.

26. A light emitting device comprising a plurality of pixels arranged on a substrate to form a plurality of columns parallel to a first direction and a plurality of rows parallel to a second direction that is orthogonal to the first direction,
wherein each of the plurality of pixels includes a light emitting element and a driving circuit configured to drive the light emitting element,
wherein the substrate includes a transistor region in which a plurality of transistors that form the driving circuit are arranged,
wherein the plurality of pixels includes a first pixel and a second pixel, which are adjacent to each other in the first direction, and a third pixel adjacent to the first pixel and the second pixel in the second direction, and a virtual line that is parallel to the second direction, which passes through the transistor region of the third pixel, passes through one of the transistor region of the first pixel and the transistor region of the second pixel, and
wherein virtual lines that are parallel to the second direction, which pass through gate electrodes of the plurality of transistors of the third pixel, do not pass through gate electrodes of the plurality of transistors of the first pixel and the second pixel.

27. A display device comprising a light emitting device as defined in claim 26, and an active element connected to the light emitting device.

28. A photoelectric conversion device comprising an optical unit including a plurality of lenses, an image capturing element configured to receive light that has passed through the optical unit, and a display unit configured to display an image,
wherein the display unit is a display unit configured to display an image captured by the image capturing element and includes a light emitting device as defined in claim 26.

29. An electronic device comprising a housing provided with a display unit and a communication unit provided in the housing, the communication unit being configured to communicate with outside of the electronic device,
wherein the display unit includes a light emitting device as defined in claim 26.

30. A wearable device comprising a display device configured to display an image, wherein the display device includes a light emitting device as defined in claim 26.

* * * * *